(12) United States Patent
Richard et al.

(10) Patent No.: US 10,859,406 B2
(45) Date of Patent: Dec. 8, 2020

(54) MAGNETIC SENSOR POSITION MEASUREMENT WITH PHASE COMPENSATION

(71) Applicant: Analog Devices Global, Hamilton (BM)

(72) Inventors: Aude Richard, Limerick (IE); Peter James Tonge, Newbury (GB); Jochen Schmitt, Biedenkopf (DE); Monsoon Dutt, London (GB)

(73) Assignee: Analog Devices Global, Hamilton (BM)

( * ) Notice: Subject to any disclaimer, the term of this patent is extended or adjusted under 35 U.S.C. 154(b) by 90 days.

(21) Appl. No.: 15/420,719

(22) Filed: Jan. 31, 2017

(65) Prior Publication Data

US 2018/0216965 A1  Aug. 2, 2018

(51) Int. Cl.
*G01D 5/165* (2006.01)
*G01D 5/244* (2006.01)
*G01R 33/09* (2006.01)
*G01D 5/14* (2006.01)
*G01R 33/00* (2006.01)

(52) U.S. Cl.
CPC ............ *G01D 5/165* (2013.01); *G01D 5/145* (2013.01); *G01D 5/2448* (2013.01); *G01D 5/24485* (2013.01); *G01R 33/0029* (2013.01); *G01R 33/09* (2013.01)

(58) Field of Classification Search
CPC ......... G01B 7/30; G01D 5/142; G01D 5/145; G01D 5/147; G01D 5/2448; G01D 5/24485; G01D 5/165; G01R 33/06; G01R 33/07; G01R 33/09; G01R 33/093; G01R 33/095; G01R 33/098; G01R 33/0023; G01R 33/0029; G01R 33/0035
See application file for complete search history.

(56) References Cited

U.S. PATENT DOCUMENTS

| 6,707,293 B2 | 3/2004 | Wan et al. |
| 7,231,313 B2 | 6/2007 | Shonai et al. |
| 2008/0100285 A1* | 5/2008 | Matsumoto ............ G01D 5/145 324/207.25 |

(Continued)

FOREIGN PATENT DOCUMENTS

| CN | 1388901 A | 1/2003 |
| CN | 1726381 A | 1/2006 |

(Continued)

OTHER PUBLICATIONS

Diegel, et al., "A New Four Bit Magnetic Domain Wall Based Multiturn Counter," IEEE Transactions on Magnetics, vol. 45, No. 10, Oct. 2009, pp. 3792-3795.

Mattheis, et al., "Multiturn Counter Using the Movement and Storage of 180° Magnetic Domain Walls," IEEE Transactions on Magnetics, vol. 42, No. 10, Oct. 2006, pp. 3297-3299.

(Continued)

*Primary Examiner* — David M Schindler
(74) *Attorney, Agent, or Firm* — Knobbe, Martens, Olson & Bear, LLP

(57) ABSTRACT

Aspects of the present disclosure relate to correcting for a phase shift between signals associated with an angle sensor and a multi-turn sensor that includes magnetoresistive elements. A processing circuit can determine a phase shift correction and generate position information based on at least the phase shift correction and a signal associated with the multi-turn sensor.

20 Claims, 20 Drawing Sheets

(56) References Cited

U.S. PATENT DOCUMENTS

| | | | |
|---|---|---|---|
| 2009/0315544 A1* | 12/2009 | Takahashi | F16C 41/007 |
| | | | 324/207.25 |
| 2010/0321006 A1 | 12/2010 | Suzuki | |
| 2013/0015844 A1 | 1/2013 | Bogos et al. | |
| 2013/0015845 A1 | 1/2013 | Fox | |
| 2015/0061656 A1* | 3/2015 | Fernandez | G01B 7/003 |
| | | | 324/207.25 |
| 2016/0245677 A1* | 8/2016 | Cosgrave | G01D 5/24461 |
| 2017/0082462 A1* | 3/2017 | Narasimhan | G01B 7/30 |
| 2017/0261345 A1 | 9/2017 | Schmitt | |

FOREIGN PATENT DOCUMENTS

| | | |
|---|---|---|
| CN | 102099695 A | 6/2011 |
| CN | 102483335 A | 5/2012 |
| DE | 102010010893 | 9/2010 |
| DE | 102011080050 | 1/2013 |

OTHER PUBLICATIONS

Novotechnik Siedle Group, "How to Substantially Reduce Encoder Cost While Gaining Functionality With Multi-Turn Rotary Position Sensors," White Paper, 8 pages. Available at: http://www.novotechnik.com/pdfs/MultiturnWhitePaperV4.pdf (accessed: Feb. 2, 2017).

Novotechnik Siedle Group, *How to Substantially Reduce Encoder Cost While Gaining Functionality With Multi-Turn Rotary Position Sensors,* White Paper (8 pgs). Available at: http://www.novotechnik.com/pdfs/MultitumWhitePaperV4.pdf (accessed Nov. 4, 2016).

Weiss, et al., *Advanced Giant Magnestoresistance Technology for Measurement Applications,* Meas. Sci. Technol. 24(2013) 082001 (17 pp).

Diegel, et al., *A New Four Bit Magnetic Domain Wall Based Multiturn Counter,* IEEE Transactions on Mag, vol. 45, No. 10 (Oct. 2009), pp. 3792-3795.

Chinese Office Action dated Nov. 25, 2019 in Chinese Patent Application No. 201810092366.4.

* cited by examiner

MAGNETIC SENSOR POSITION MEASUREMENT WITH PHASE COMPENSATION

FIELD OF DISCLOSURE

The disclosed technology relates to measuring position using magnetic sensors.

BACKGROUND

Magnetic sensors can be used to sense angular position of a mechanical rotational device such as a gear or rotating disk. For instance, magnetic sensors can be used to sense the rotational position of any suitable object that includes or is coupled to a magnetic target. Magnetic sensors can be used in automotive applications, among other applications. For instance, magnetic angle sensors can be used in detecting a steering wheel angle in a vehicle.

Magnetoresistance can occur in thin film structures when two ferromagnetic layers are separated by a relatively thin non-magnetic film. When two magnetic layers are parallel, resistance can drop to a minimal value. As the magnetic layers are turned so they are no longer in parallel alignment, electrical resistance can increase. Magnetic sensors can include giant magnetoresistance (GMR) resistors made with alternating ferromagnetic alloy layers and non-magnetic layers. The resistance of the GMR resistor can be sensitive to and varies with changes in an applied magnetic field. Wheatstone bridges using GMR resistors can be patterned on a semiconductor chip to detect the angular and linear motion of a magnet.

When using GMR magnetic sensors for measuring position, sources of error can be introduced into the position measurement. There can be sensor related errors and/or magnetic field input related errors. Sensor related errors can include intrinsic nonlinearities in the GMR resistor and/or hysteresis. Magnetic field input related errors can be related to field strength and/or field angle.

SUMMARY OF THE DISCLOSURE

For purposes of summarizing the disclosure, certain aspects, advantages and novel features of the inventions have been described herein. It is to be understood that not necessarily all such advantages may be achieved in accordance with any particular embodiment of the invention. Thus, the inventions may be embodied or carried out in a manner that achieves or optimizes one advantage or group of advantages as taught herein without necessarily achieving other advantages as may be taught or suggested herein.

One aspect of this disclosure is a magnetic sensor system comprising a multi-turn sensor, an angle sensor, and a processing circuit. The multi-turn sensor includes magnetoresistive sensing elements. The processing circuit is in communication with the multi-turn sensor and the angle sensor. In addition, the processing circuit is configured to determine a phase shift correction based on an output of the multi-turn sensor and an output of the angle sensor. The processing circuit is configured to generate position information based on the phase shift correction and the output of the multi-turn sensor.

The magnetic sensor system can further comprise a half-turn decoder. The half-turn decoder can be configured to output a half-turn count based on the output of the multi-turn sensor. The processor can be configured to determine the phase shift correction based on the half turn count and the output of the angle sensor.

The phase shift correction can correspond to adding 360° when the half-turn count is a particular parity and the output of angle sensor corresponds to an angle of less than 90°. The particular parity can be odd.

The phase shift correction can also correspond to subtracting 360° when the half-turn count is an opposite of the particular parity and the output of angle sensor corresponds to the angle being greater than 270°.

The processing circuit can be configured to generate the position information based on the phase shift correction, the output of the multi-turn sensor, and the output of the angle sensor. The multi-turn sensor can be a giant magnetoresistance sensor, and the angle sensor can comprise an anisotropic magnetoresistive sensor.

The processing circuit can be configured to compute the position information, without the phase shift correction, in response to determining that the output of the multi-turn sensor and the output of the angle sensor are sufficiently in phase.

The phase shift correction can correspond to an adjustment of 360° in the position information. The position information can be a rotation angle associated with a magnetic field. The processing circuit can be configured to output continuous position information.

Another aspect of this disclosure is a method of determining position information associated with a magnetic field comprises determining a phase shift correction based on a first signal and a second signal and generating position information. The first signal is associated with a multi-turn sensor comprising magnetoresistive sensing elements, and the second signal is associated with an angle sensor. Position information is associated with the magnetic field based on the phase shift correction and the first signal.

The method can further comprise decoding a half-turn count from the first signal, wherein the determining is based on the half-turn count. The first signal can respresent a half-turn count. The phase shift correction can correspond to adding one full turn when the half-turn count is a particular parity and the second signal corresponds to an angle of less than one quarter turn. The phase shift correction can correspond to subtracting one full turn when the half-turn count is an opposite of a particular parity and the second signal corresponds to an angle of more than three quarters of a turn. The particular parity can be odd, and then the opposite of the particular parity is even. The multi-turn sensor can comprise a giant magnetoresistive sensor.

Another aspect of this disclosure is a processing circuit for determining a position associated with a magnetic field. The processing circuit comprises a first input, a second input, and electronic circuitry. The first input is configured to receive a first signal associated with a multi-turn sensor. The second input is configured to receive a second signal associated with an angle sensor. The electronic circuitry is configured to determine a phase shift correction based on the first signal and the second signal, to generate position information associated with the magnetic field based on the phase shift correction and the first signal, and to output the position information.

The electronic circuitry can be configured to compute a half-turn count based on the first signal and to determine the phase shift correction based on the half-turn count. The first signal can represent a half-turn count and the electronic circuitry can be configured to determine the phase shift correction based on the half-turn count. The phase shift correction can correspond to adding one full turn when the half turn count is a particular parity and the second signal corresponds to less than a quarter turn. The particular parity can be odd. The phase shift correction can correspond to subtracting one full turn when the half turn count is an opposite of the particular parity and the second signal corresponds more than a three quarter turn.

The electronic circuitry can be configured to compute the position information without the phase shift correction in response to determining that the output of the multi-turn sensor and the output of the angle sensor are sufficiently in phase.

BRIEF DESCRIPTION OF THE DRAWINGS

These drawings and the associated description herein are provided to illustrate specific embodiments and are not intended to be limiting.

DETAILED DESCRIPTION

Figure 1:
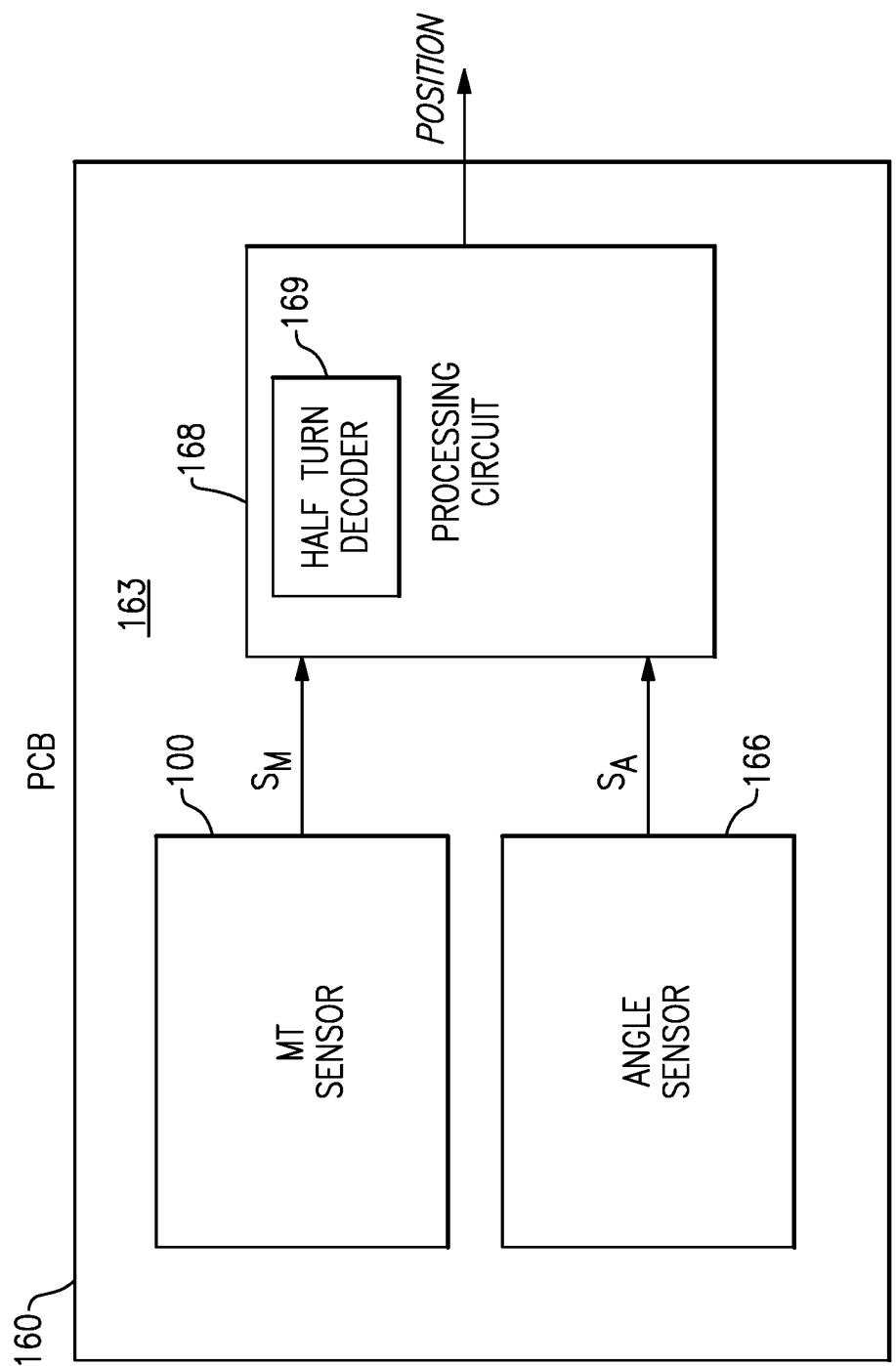
FIG. 1 is a schematic block diagram of a magnetic sensor system that includes a multi-turn sensor and an angle sensor according to an embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Magnetic sensors can be used to monitor the angular position and rotational velocity of a moving shaft. Such magnetic sensing can be applied to a variety of different applications, such as automotive applications, medical applications, and industrial control applications, among others. Several technologies exist for making magnetic sensors. For instance, there are Hall-effect sensors. Hall-effect sensors can generate direct current (DC) output voltages based on the strength of an applied magnetic field. A rotating magnetic field creates sinusoidal waveforms in Hall-effect sensors which can then be processed by a computer to calculate angle. There are also giant magnetoresistance (GMR) sensors. In a GMR sensor, GMR resistors are formed using layers of ferromagnetic and non-magnetic materials. The GMR resistors can be used in Wheatstone bridges to sense variations in rotating magnetic fields.

Magnetic sensors can be integrated on a chip for sensing and recording the number of turns in half-turn increments, in which states can change every quarter turn, or for sensing the angle of a rotating magnetic field. A magnetic sensor for sensing and recording the number of turns in quarter-turn increments can be referred to as a multi-turn (MT) sensor. A magnetic sensor for sensing the rotational angle over a range of 360 degrees can be referred to as an angle sensor or as a single turn (360 degrees) angle sensor. Both a multi-turn sensor and an angle sensor can be used together to determine the rotational angle position that exceeds 360 degrees. This combination of a multi-turn sensor with an angle sensor can also be referred to as a multi-turn angle sensor.

Additional circuitry can be used to process and/or convert signals from the multi-turn sensor and the angle sensor into useful information. For instance, an analog-to-digital converter (ADC) can be used to convert voltages from the sensors into digital data that can be processed into the overall rotational angle position and/or angular velocity. The accuracy of these conversions can depend upon many factors including sensor placement, environmental factors such as temperature, and magnetic field strength, to name a few. In a multi-turn angle sensor, there can also be relative error between information from its angle sensor and information from its multi-turn sensor. In particular, there can be a phase shift error due to differences in how the multi-turn sensor and the angle sensor sense a rotation of the magnetic field. Without compensation, this phase shift error can lead to discontinuities in the overall rotational angle position data. Accordingly, there is a need for a way to compensate for the phase shift errors in the multi-turn angle sensor.

Methods and circuits for combining multi-turn sensor and 360 degree position sensor outputs and compensating for phase shifts are disclosed herein. The method of compensation can be implemented within any suitable processing circuit, such as a processor or microprocessor (MPU), and the overall rotational angle position data of a rotating shaft can be computed so as to correct for discontinuities due to phase shift errors.

Certain multi-turn sensors, such as GMR sensors, can experience hysteresis. With hysteresis, an output of a multi-turn magnetic sensor can toggle out of phase with an output of a magnetic angle sensor exposed to the same magnetic field. This can cause a relative phase shift in signals associated with the multi-turn magnetic sensor and the magnetic angle sensor. In some instances, magnetoresistive elements in a GMR sensor can change state at different times and/or sensor state transitions can occur at different angles depending on a direction of rotation of a magnetic field (e.g., clockwise or counterclockwise). Such effects can cause errors determining position information from multi-turn sensor information. Alternatively or additionally, the physical positions of the multi-turn magnetic sensor and the magnetic angle sensor can cause a relative phase shift in signals associated with these sensors. There can be unequal delays associated with signal propagation and/or processing associated with the multi-turn magnetic sensor and the magnetic angle sensor that can contribute to a relative phase shift in signals associated with these sensors.

Without compensation, the relative phase shift between a first signal associated with a multi-turn sensor and a second signal associated with an angle sensor can cause an error in position information computed from the first signal and the second signal. Aspects of this disclosure relate to determining a phase shift correction based on the first signal and the second signal and generating position information based on the phase shift correction. This can provide accurate position information in the presence of hysteresis of the multi-turn sensor and/or other causes of a relative phase difference between a first signal associated with a multi-turn sensor and a second signal associated with an angle sensor.

The phase shift correction can be applied to generating position information from an output of any suitable multi-turn sensor and any suitable angle sensor. The multi-turn sensor can include magnetoresistive sensing elements. For instance, the multi-turn sensor can be a GMR sensor. The angle sensor can include any suitable angle sensor, such as a Hall effect sensor, an anisotropic magnetoresistive (AMR) sensor, other magnetoresistive sensing elements, or the like. The angle sensor can provide an output indicative of an angle in a range from 0 degrees to 360 degrees.

The position information can represent an angle associated with a magnetic field. For instance, the position information can represent rotations of a magnetic field. The magnetic field can be generated by a magnetic target, which can include one or more magnets. Such a magnetic target can be part of or attached to any suitable object, such as a shaft, gear, linear or rotary actuator, a modular clutch actuator (MCA), steering wheel, etc. The position information can represent an angle or rotation, which can correspond to more than more 360 degree rotation. Accordingly, the position information can represent an overall angle of rotation an object that includes or is attached to the magnetic target.

In some instances, the position information can represent a number of half-turns or full turns. In such instances, the angle sensor can be a quadrant detector, such as an AMR quadrant detector, and the phase shift correction can be determined from the quadrant detector and a signal associated with the multi-turn sensor in accordance with the principles and advantages discussed herein. Then the position information can be determined based on an output of the multi-turn sensor and the phase shift correction.

FIG. 1 is a schematic block diagram of a magnetic multi-turn angle sensor system 160 that includes a multi-turn (MT) sensor 100 and an angle sensor 166 according to an embodiment. The multi-turn angle sensor system 160 can also include a processing circuit 168 and a printed circuit board (PCB) 163 on which the MT sensor 100, the angle sensor 166, and the processing circuit 168 are disposed. The processing circuit 168 can receive signal(s) $S_M$ from the MT sensor 100 and signal(s) $S_A$ from the angle sensor 166 and then process these received signals to provide a rotational angle position Position. The processing circuit 168 can include a half-turn decoder 169. The half-turn decoder 169 can receive signal(s) $S_M$ from the MT sensor 100 and output a half-turn count. The half-turn count can be used to determine a phase shift correction, for example, as will be discussed in more detail below. The signal(s) $S_M$ from the MT sensor 100 and the signal(s) $S_A$ from the angle sensor 166 can be analog signals. For instance, the signal(s) $S_M$ from the MT sensor 100 can be voltage signals derived from resistor networks, such as Wheatstone bridges including GMR resistors.

Ideally, the signal(s) $S_M$ from the MT sensor 100 and the signal(s) $S_A$ from the angle sensor 166 would have zero time delay. However, environmental and/or physical effects such as temperature, magnetic field strength, sensor placement, or any combination thereof can introduce a non-zero time delay between the signals $S_M$ and $S_A$. For instance, if the MT sensor 100 senses and provides information relating to the rotating magnetic target's position faster than the angle sensor 166 senses and provides information, then signals from the angle sensor 166 are delayed with respect to signals from the MT sensor. This delay can, in turn, give rise to phase shift errors.

The teachings herein present methods and circuits for correcting for phase shift error between the angle sensor 166 and the multi-turn sensor 100. The processing circuit 168 can implement a method to determine a phase shift correction to correct for a relative phase shift between signal(s) $S_M$ from the MT sensor 100 and signal(s) $S_A$ from the angle sensor 166. The processing circuit 168 can be implemented by any suitable electronic circuitry configured to determine a phase shift correction, determine position information based on the phase shift correction, and output the position information. Examples of an MT sensor 100 and an angle sensor 166 are shown in FIGS. 2A and 2B, respectively.

Figure 2A:
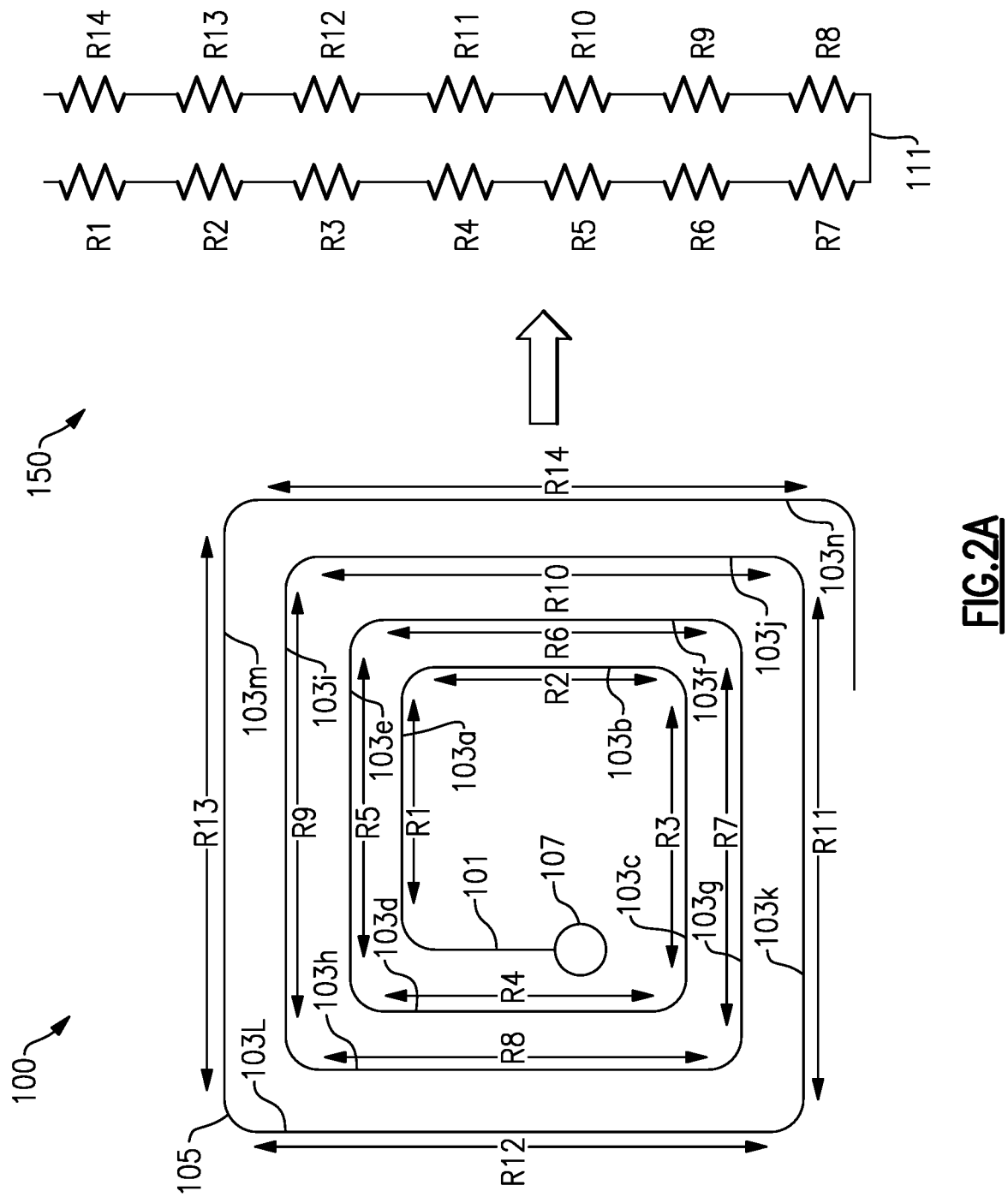
FIG. 2A shows an example magnetic strip layout representation of a multi-turn sensor with a corresponding circuit schematic representation according to an embodiment.
Figure 2B:
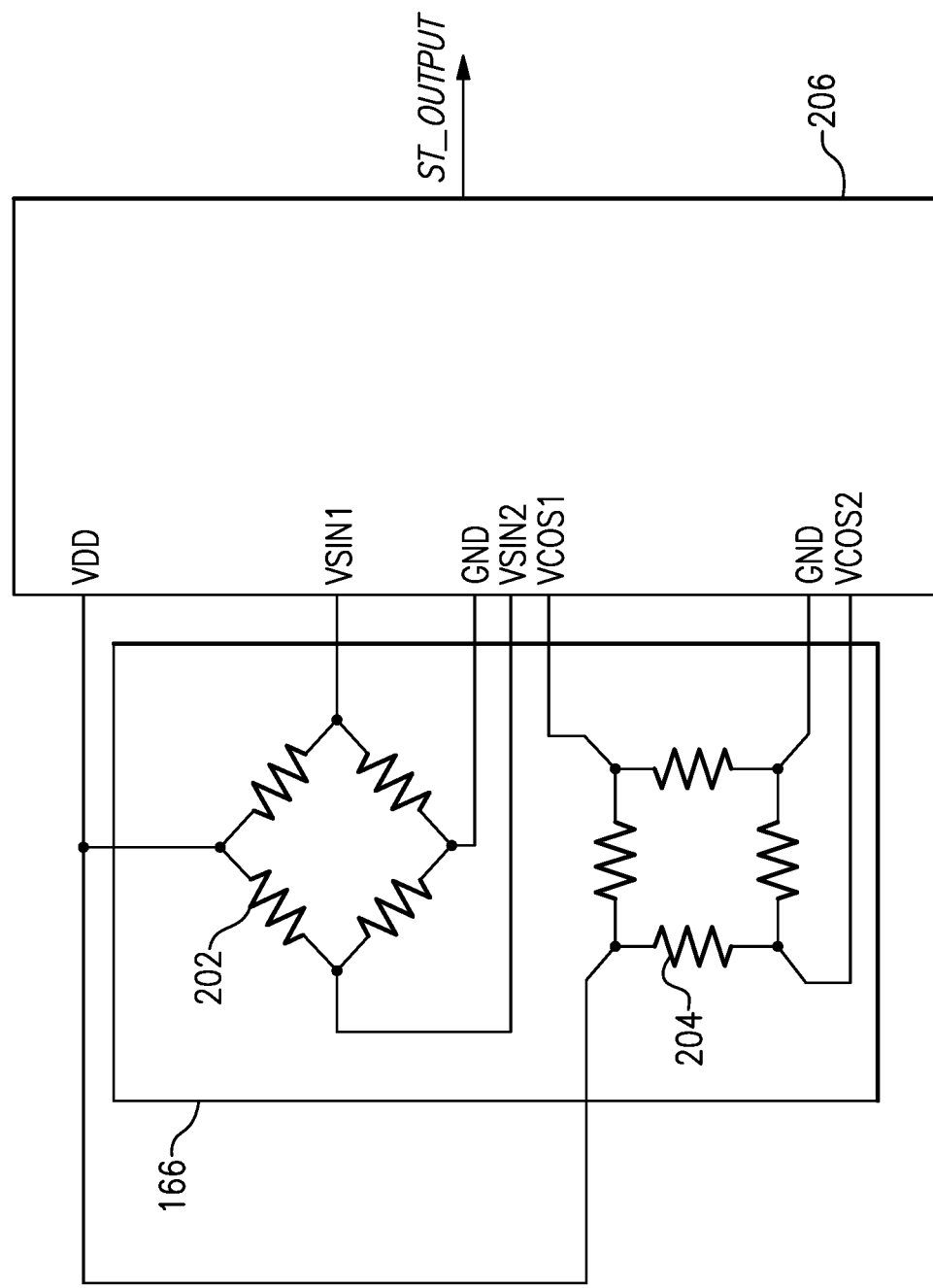
FIG. 2B is a schematic diagram showing an example of a magnetic angle sensor with an interface circuit according to an embodiment.

FIG. 2A shows an example magnetic strip layout representation of a multi-turn sensor 100 with a corresponding circuit schematic representation 150 according to an embodiment. In the embodiment of FIG. 2A, a magnetic strip 101 is patterned on a chip. The magnetic strip 101 has corners 105 and segments 103a to 103n forming magnetoresistive elements R1 to R14 arranged in series with each other, and a domain wall generator 107. The magnetoresistive elements can act as variable resistors that change resistances in response to a magnetic alignment state. The magnetic strip pattern of the multi-turn sensor 100 illustrated can be implement in a multi-turn counter that can count at least 3 turns.

The magnetic strip 101 can be a giant magnetoresistance track that is physically laid out in the shape of a spiral. As illustrated in FIG. 2A, such a spiral shaped magnetic strip 101 can have rounded corners 105 and segments 103a to 103n. The magnetic strip 101 can have a magnetic anisotropy, such as a high anisotropy, based on the material and cross sectional dimensions of the magnetic strip 101. The magnetic strip 101 can store magnetic energy. A domain wall generator (DWG) 107 is coupled to one end of the magnetic strip 101. The DWG 107 can have a magnetic anisotropy, such as a low anisotropy. The domain wall generator can generate domain walls in response to rotations in a magnetic field. The domain walls can be injected to the magnetic strip 101.

The segments 103a to 103n of the magnetic strip 101 are shown as straight sides of the magnetic strip 101 in the example of FIG. 2A. The segments 103a to 103n can have a variable resistance based on the magnetic domain of the segment. As the magnetic domain of a segment changes, the resistance of that segment can change. Accordingly, the segments 103a to 103n can operate as magnetoresistive elements, also referred to as variable resistors R1 to R14, respectively, herein. The magnetoresistive elements R1 to R14 can also function as non-volatile, magnetic memory that can be magnetically written and electrically read. The magnetoresistive elements R1 to R14, as laid out in the spiral shaped magnetic strip 101, are coupled in series with each other. Corresponding circuit schematic representation 150 shows segments 103a to 103n depicted as corresponding magnetoresistive elements R1 to R14, respectively, connected in series.

FIG. 2B is a schematic diagram showing an example of a magnetic angle sensor 166 with an interface circuit 206 according to an embodiment. The interface circuit 206 can be part of the processing circuit 168. Alternatively, the interface circuit 206 can be a separate circuit between the processing circuit 168 and the output of the angle sensor 166. As shown in FIG. 2B, the angle sensor 166 includes a first Wheatstone bridge 202 and a second Wheatstone bridge 204. The first and second Wheatstone bridges 202 and 204, respectively, can include magneto-resistive elements, such as AMR elements, to sense a rotating magnetic field and to provide rotational angle between 0 and 360 degrees, which also corresponds to an angle of between 0 and $2\pi$ radians. Additionally, each AMR element can be patterned onto an integrated circuit using an AMR process so that the first Wheatstone bridge 202 is rotated with respect to the second Wheatstone bridge 204. By having the first and second Wheatstone bridges 202 and 204 rotated with respect to each other, the trigonometric sine and cosine of a rotational magnetic field can be determined over a range of 0 to 360 degrees.

As shown in FIG. 2B, both the first and the second Wheatstone bridges 202 and 204, respectively, are electrically connected to a supply voltage VDD and to ground GND. As illustrated, the interface circuit 206 receives voltages VSIN1 and VSIN2 from the sense nodes of the first Wheatstone bridge 202 and receives voltages VCOS1 and VCOS2 from the sense nodes of the second Wheatstone bridge 204. The voltages VSIN1, VSIN2, VCOS1, and VCOS2 of FIG. 2B can represent components of the signals $S_A$ of FIG. 1. The interface circuit 206 can process the voltages VSIN1 and VSIN2 and the voltages VCOS1 and VCOS2 to determine sine and cosine signals, respectively, associated with a magnetic field. From the sine and cosine signals, the interface circuit 206 can determine an the angle of the magnetic field between 0 and 360 degrees. In the embodiment of FIG. 2B, the interface circuit 206 provides a single turn angle output data ST_Output.

Figure 3:
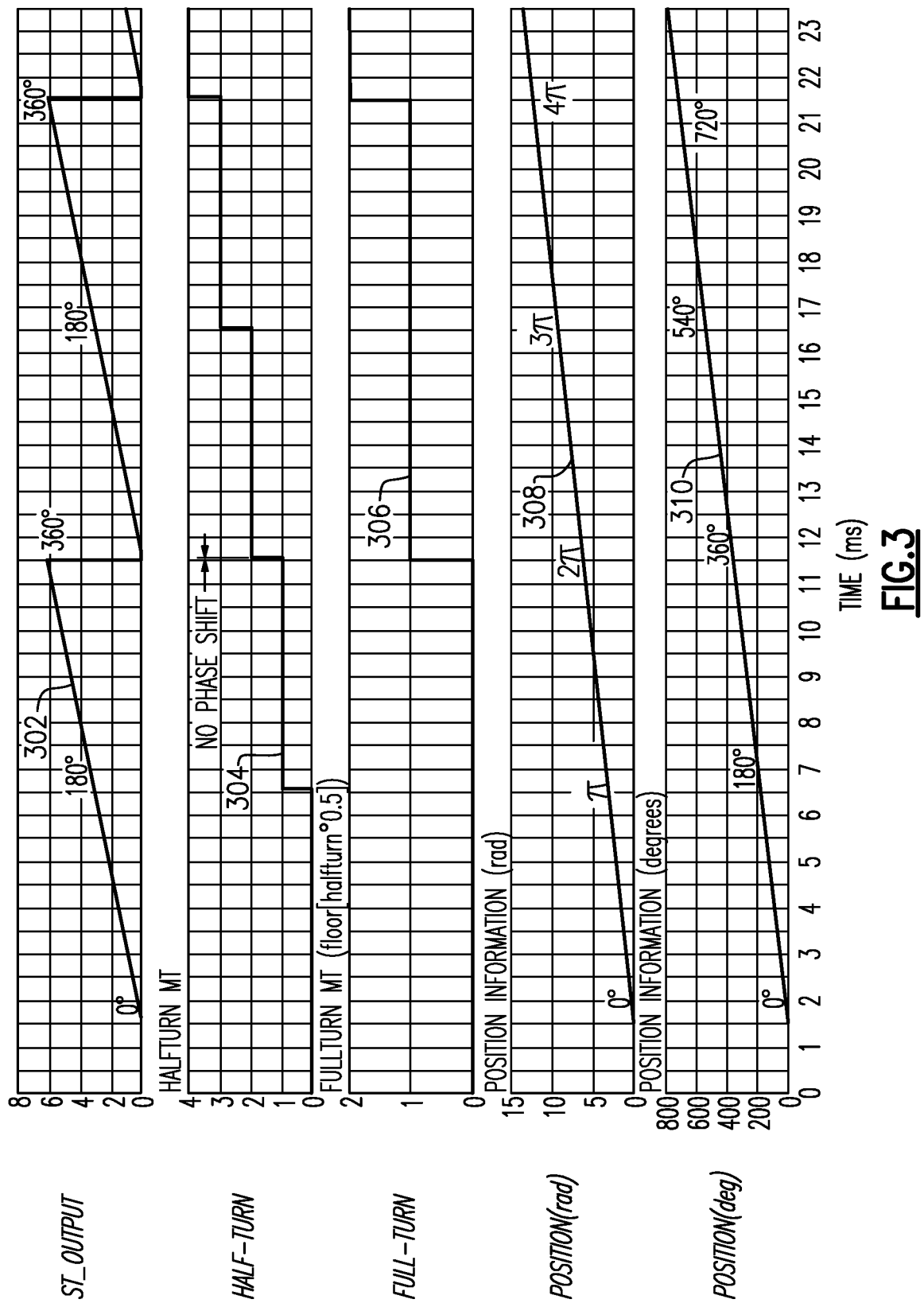
FIG. 3 shows simulated plots of angular position information with no phase shifting.

FIG. 3 shows simulated plots 302, 304, 306, 308, and 310 of angular position information with no phase shifting. Plot 302 is a plot of the single turn (ST) angle output data ST_Output, as determined from an angle sensor 166, in degrees versus time in milliseconds (ms). As shown in FIG. 3, the ST angle output data ST_Output illustrates that rotations begin from an angle of 0 degrees at time of approximately 1.75 ms. Also, as shown in FIG. 3, the ST angle output data ST_Output can increase linearly with time as a periodic triangular waveform with angles ramping from 0 to 360 degrees. This waveform can correspond to a magnetic field rotating at a substantially constant rate. Plot 304 is a plot of the simulated number of half-turn rotations, also referred to as half-turn count Half-turn, of a magnetic target. The half-turn count Half-turn is a number that can be calculated by a processor, such as the processing circuit 168, based on the signal(s) $S_M$ from the MT sensor 100. As shown in FIG. 3, half turns should increment by one each time the magnetic field undergoes 180 degrees of rotation. For instance, between times of approximately 1.75 ms and 6.5 ms, the half-turn count Half-turn is 0 because the total rotational angle is less than 180 degrees. Plot 306 is a plot of the full turn rotations, also referred to as the full turn count Full-turn, of the magnetic target. The full turn count Full-turn is also a number which can be calculated by a processor, such as the processing circuit 168. As shown in FIG. 3, the full turn count increments by one each time the magnetic field undergoes 360 degrees of rotation. For instance, for times between approximately 1.75 ms and 11.5 ms, the full turn count Full-turn is 0 because the total rotational angle is less than 360 degrees.

Phase shift can be measured by observing time delay between points on plots 302 and 304. For instance, the time delay can be the difference between the ST angle output data ST_Output transitioning from 360 degrees to 0 degrees and the half-turn count Half-turn transitioning to a new half-turn count value. This time delay can represent a phase shift between information from the angle sensor 166 and the MT sensor 100. The plots 302 and 304 represent a simulated ideal case where a step in the ST angle output data ST_Output is in phase and aligned with a step in the half-turn count Half-turn. For instance, as shown at time equal to approximately 11.6 ms, plot 302 indicates a full angle of 360 degrees and plot 304 simultaneously indicates a transition from 1 half-turn to 2 half turns. Thus, the simulations of FIG. 3 are ideal in that there is no time delay between data associated with the angle sensor 166 and the MT sensor 100.

Using information from both the angle sensor and half-turn data, the processing circuit 168 can determine the rotational angle position data Position as a function of the half-turn count Half-turn and the ST angle output data ST_Output. Plot 308 shows the overall rotation angle position data Position(rad) expressed in units of radians and plot 310 shows the overall rotational angle position data Position (deg) expressed in units of degrees. Mathematical equations that can be used to calculate the overall rotational angle position, Position, are provided below.

The ST angle output data ST_Output can be expressed in radians or degrees. Referring to FIG. 3, plot 302 shows the ST angle output data ST_Output expressed in degrees. A complete single turn covers a range of angles from 0 to $2\pi$ radians or 0 to 360 degrees. The half-turn count Half-turn, which is determined from signal(s) $S_M$ of a multi-turn sensor, has half-turn resolution. A full-turn count Full-turn can be derived using Equation 1 in terms of the half-turn count Half-turn.

$$\text{Full-turn} = \text{Floor}(\text{Half-turn} \times 0.5) \quad \text{Eq. 1}$$

Equation 2 can represent the overall angle position data Position in radians and can be calculated by converting the full-turn count Full-turn to radians and adding the result with the ST angle sensor output data ST_Output in radians.

$$\text{Position(rad)} = (\text{Full-turn} \times 2\pi) + \text{ST\_Output} \quad \text{Eq. 2}$$

Alternatively, Equation 3 provides the overall position information in degrees (°) and can be calculated by converting both the full-turn count Full-turn to degrees and the ST angle sensor output data ST_Output to degrees and then adding these values.

$$\text{Position(deg)} = (\text{Full-turn} \times 360°) + (\text{ST\_Output} \times 57.3) \quad \text{Eq. 3}$$

Figure 4:
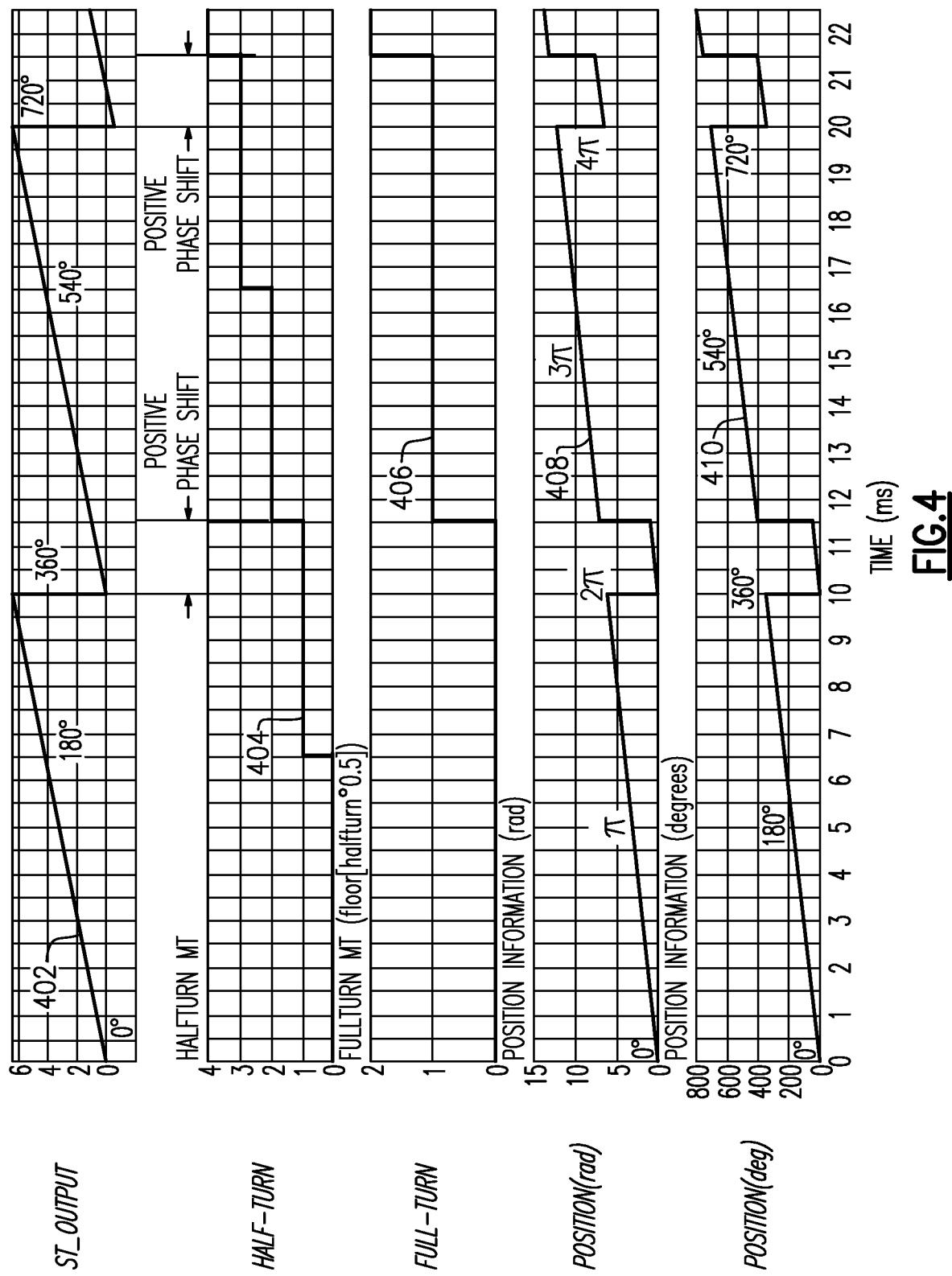
FIG. 4 shows simulated plots of angular position information with positive phase shifting.

FIG. 4 shows simulated plots 402, 404, 406, 408, and 410 of angular position information with positive phase shifting. Plot 402 shows the ST angle output data ST_Output when the magnetic field is rotating with angles increasing from 0 to 360 degrees. Plot 404 is the half-turn count Half-turn as determined from calculations and processing of signals originating from the MT sensor. Plot 406 is a plot of the full turn count Full-turn, for example, as determined by Equation 1. The full turn count Full-turn and the half-turn count Half-turn can be calculated by a processor, such as the processing circuit 168 of FIG. 1.

As shown in FIG. 4, the half-turn count Half-turn of plot 402 is delayed relative to the single turn angle output data ST_Output of plot 404 by approximately 1.5 ms. This time delay corresponds to a positive phase shift. As shown in FIG. 4, ST angle output data ST_Output transitions from 360 degrees to 0 degrees and then ramps to an angle greater than zero before the half-turn count Half-turn increments. As described above, some the reasons for a delay (either positive or negative) between the output of the MT sensor and the angle sensor can depend upon environment, signal conditions, design, hysteresis of the MT sensor, the like, or any combination thereof. The phase shift introduces error in the form of a discontinuity in the overall rotation angle position data Position. For instance, due to the positive phase shift, there are discontinuities in plots 408 and 410 of the overall rotation angle position data Position(rad) and Position(deg), respectively. As shown in FIG. 4, there is an error present when the output of the angle sensor moves on to the second turn in the sequence (at approximately 10 ms) and the half-turn count Half-turn has not yet incremented accordingly.

Errors in the overall rotation angle position Position and are shown to occur at times of approximately 10 ms to 11.6 ms and 20 ms to 21.6 ms in FIG. 4. To remove the error, a method of compensating for the phase shift can be implemented by a processing circuit, such as processing circuit 168 of FIG. 1. The processing circuit 168 can also compute position information without the phase shift correction in response to determining that the output of the multi-turn sensor and the output of the angle sensor are sufficiently in phase. For instance, in the case associated with the plots of FIG. 3, the processing circuit can determine that a phase shift correction is not needed based on the ST angle output data and the half-turn count.

Figure 5:
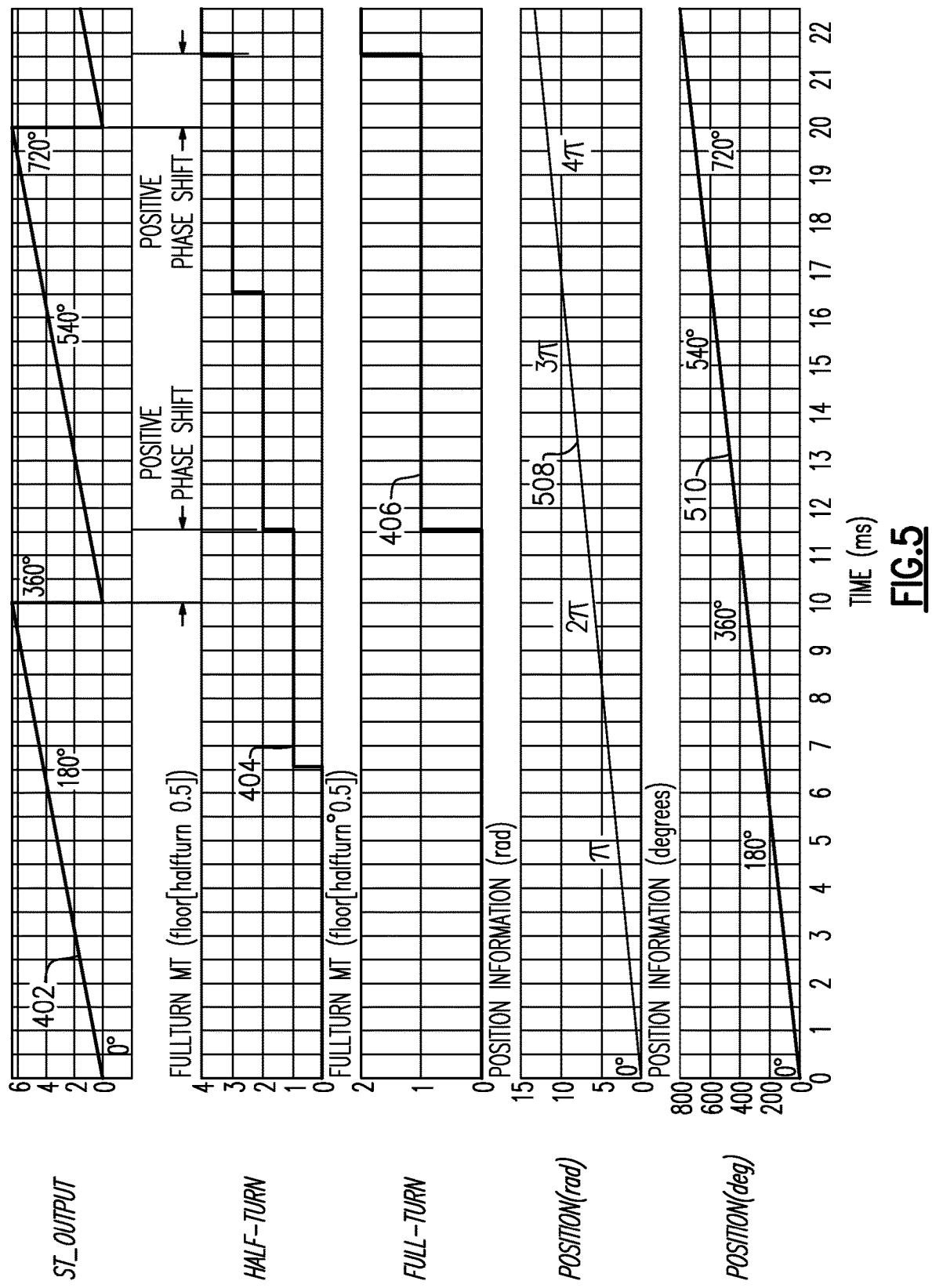
FIG. 5 shows simulated plots of angular position information with correction for positive phase shifting according to an embodiment.

FIG. 5 shows simulated plots 402, 404, 406, 508, and 510 of angular position information with correction for positive phase shifting according to an embodiment. A phase shift correction can be determined and applied by the processing circuit 168 to correct for the relative phase shift between the ST angle output data ST_Output and the half-turn count Half turn. The phase shift correction can prevent the errors in calculated position shown in the plots 408 and 410 of FIG. 4. The phase shift correction can be added to the ST angle output data ST_Output and the half-turn count Half turn at certain times to calculate the angle position data Position in a manner that compensates for the relative phase shift between these signals. In FIG. 4, there are errors in the angle position data Position when the output of the angle sensor moves on to the second turn in the sequence (at approximately 10 ms) and the multi-turn sensor is still indicating a value that corresponds to the first turn in the sequence as evident from the odd value of the half-turn count. Therefore, a correction of one full turn (adding 360 degrees) can be applied when the half-turn count Half turn output from the MT sensor is odd and the ST angle output data ST_Output is in the first quadrant of the next turn in the sequence (less than 90 degrees). By adding 360 degrees under these conditions, the processing circuit 168 can correct for the errors associated with the phase shift between the ST angle output data ST_Output and the half-turn count Half_turn. This can remove the discontinuities to yield continuous plots 508 and 510 of the overall rotation angle position data Position.

Figure 6:
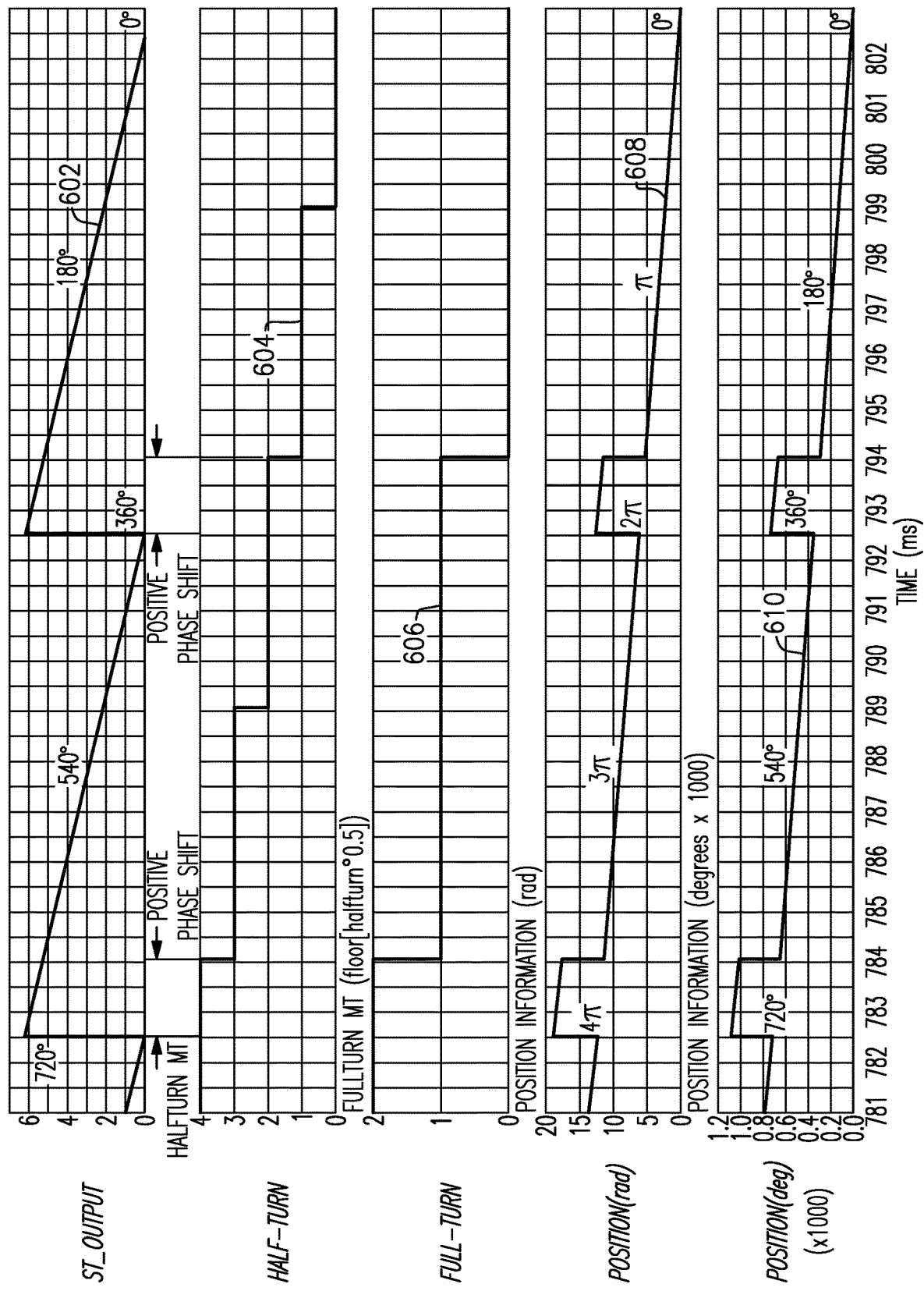
FIG. 6 shows simulated plots of angular position information with positive phase shifting in which angular position is changing in an opposite direction relative to the simulated plots of FIG. 4.

FIG. 6 shows simulated plots 602, 604, 606, 608, and 610 of angular position information with positive phase shifting in which angular position of a magnetic field is changing in an opposite direction relative to the simulated plots of FIG. 4. Plot 602 shows the ST angle output data ST_Output when the magnetic field is rotating with angles decreasing from 360 to 0 degrees. Thus, the plots of FIG. 6 are similar to the plots of FIG. 4, except the magnetic field is rotating in the opposite direction. Plot 604 is the half-turn count Half-turn which is determined by the signals originating from an MT sensor. Plot 606 is a plot of the full turn count Full-turn, for example, as determined by Equation 1. Similar to FIG. 4, there is a time delay of approximately 1.5 ms between certain transitions in the plot 604 of the half-turn count Half-turn and corresponding transitions in the plot 602 of the ST angle output data ST_Output. The time delay corresponds to a positive phase shift, which can in turn introduce an error in the overall rotation angle position data Position. For instance, due to the positive phase shift and the absence of compensation, there are discontinuities in plots 608 and 610 of the overall rotation angle position data Position(rad) and Position(deg), respectively. For instance, an error is present when the angle sensor output moves on to the last full-turn in the sequence (at 792.5 ms) while the multi-turn sensor is still indicating a value that corresponds to the second to last turn in the sequence, as evident from the even value of the half-turn count.

The errors in the overall rotation angle position data Position and are shown to occur in the plots 608 and 610 at times of approximately 782.5 ms to 784 ms and 792.5 ms to 794 ms. To remove the error, a method of compensating for the phase shift can be implemented by a processing circuit, such as the processing circuit 168 of FIG. 1.

Figure 7:
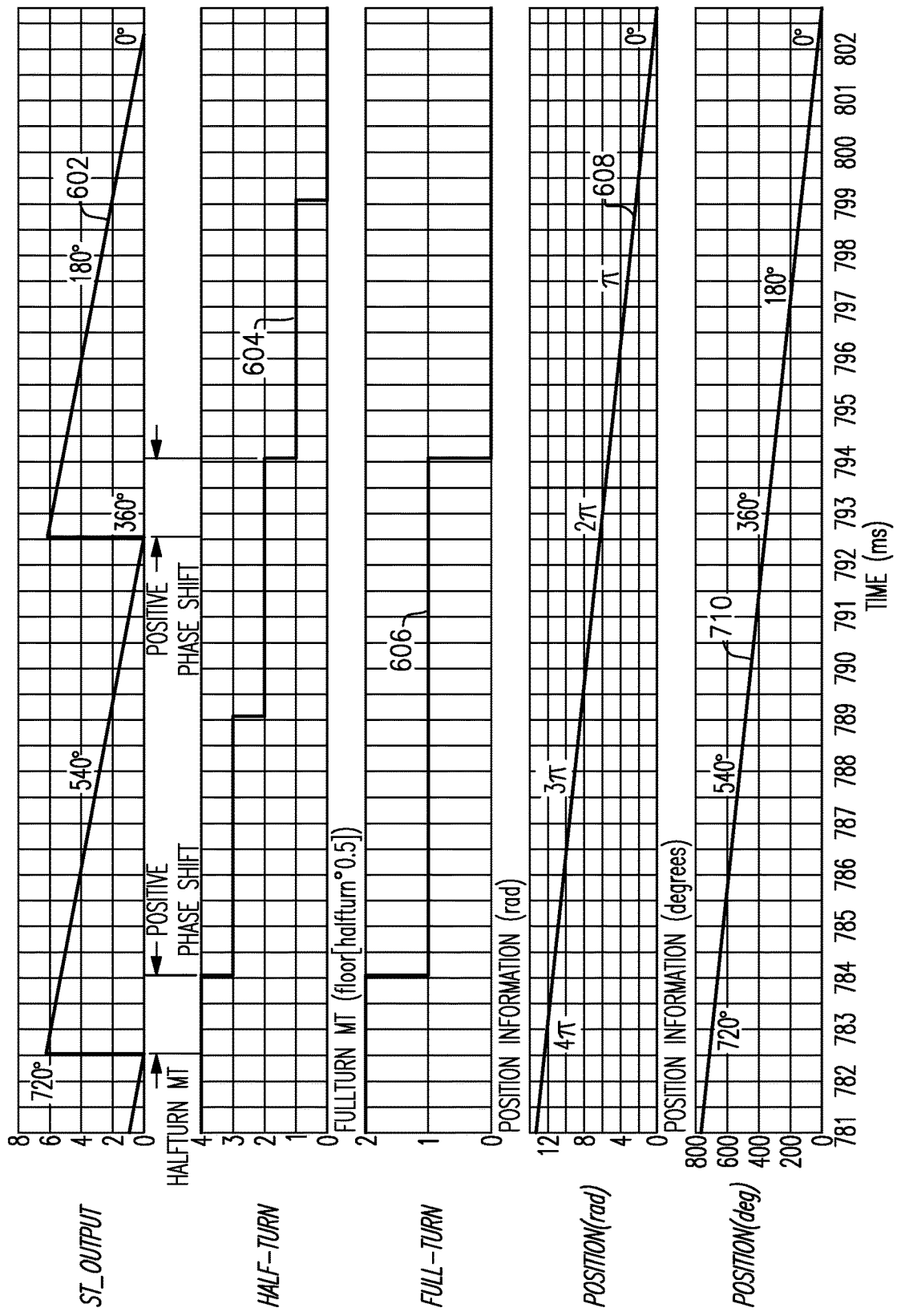
FIG. 7 shows simulated plots of angular position information with correction for positive phase shifting according to an embodiment.

FIG. 7 shows simulated plots 602, 604, 606, 708, and 710 of angular position information with correction for positive phase shifting according to an embodiment. A phase shift correction can be determined and applied by the processing circuit 168 to correct for the relative phase shift between the ST angle output data ST_Output and the half-turn count Half_turn. The phase shift correction can be subtracted from the sum of the ST angle output data ST_Output and the half-turn count Half_turn at certain times to calculate the angle position data Position in a manner that compensates for the relative phase shift between these signals. In FIG. 6, there are in an error in angle position data Position when the output of the angle sensor moves on to the last full-turn in the sequence (at 792.5 ms) while the multi-turn sensor is still indicating a value that corresponds to the second to last turn in the sequence as evident from the even value of the half-turn count Half_turn. Therefore, a correction of decrementing one full-turn (subtracting 360 degrees) can be applied when the half-turn count Half_turn is even and the ST angle output data ST_Output is in the fourth quadrant (greater than 270 degrees) of the next full-turn. By subtracting 360 degrees under these conditions, the processing circuit 168 can correct for the errors associated with the relatively phase shift between the ST angle output data ST_Output and the half-turn count Half_turn. This can yield continuous plots 708 and 710 of the overall rotation angle position data Position.

Figure 8:
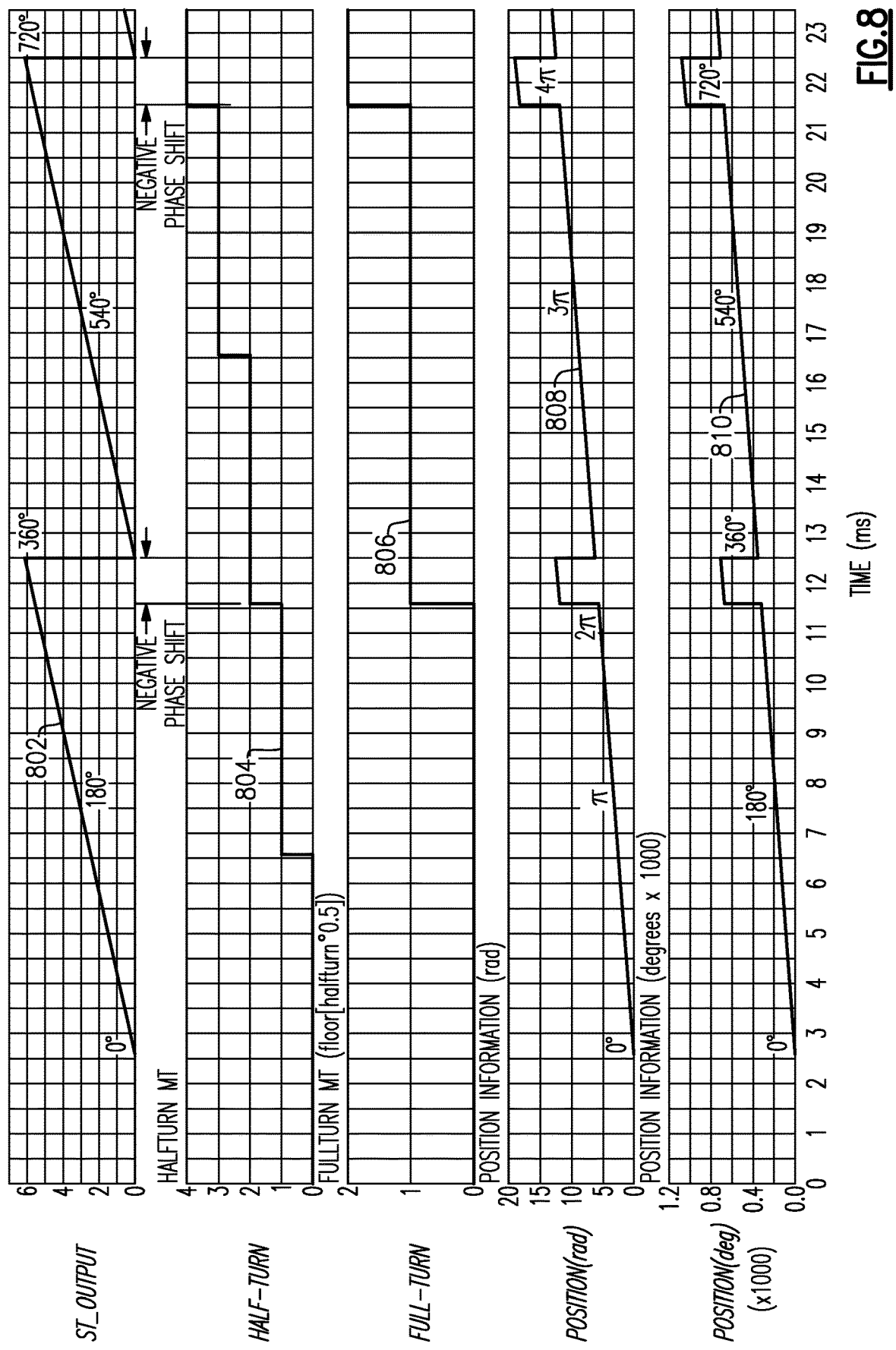
FIG. 8 shows simulated plots of angular position information with negative phase shifting.

FIG. 8 shows simulated plots 802, 804, 806, 808, and 810 of angular position information with negative phase shifting. Plot 802 shows the ST angle output data ST_Output when the magnetic field is rotating with angles increasing from 0 to 360 degrees. The plots of FIG. 8 are like the plots of FIG. 4, except the phase shift is negative. For a negative phase shift, the half-turn output Half-Turn transitions before corresponding transitions in the ST angle output data ST_Output. Plot 804 is the half-turn count Half-turn which is determined by the signals originating from an MT sensor. Plot 806 is a plot of the full turn count Full-turn, for example, as determined by Equation 1. In FIG. 8, there is a time delay of approximately 1.0 ms between certain transitions in the plot 804 of the half-turn count Half-turn and corresponding transitions in the plot 802 of the ST angle output data ST_Output. The time delay corresponds to a phase shift, which can in turn introduce an error in the form of a discontinuity in the overall rotation angle position data Position. For instance, due to the negative phase shift, there are discontinuities in plots 808 and 810 of the overall rotation angle position data Position(rad) and Position(deg), respectively. The error is present when the multi-turn sensor output moves on to a value that corresponds to the second turn in the sequence (at 11.5 ms) as evident from the even value of the half-turn count Half-Turn while the ST sensor output data ST_Output still corresponds to the first turn in the sequence.

The errors in the overall rotation angle position data Position and are shown to occur in the plots 808 and 810 at times of approximately 11.5 ms to 12.5 ms and 21.5 ms to 22.5 ms. To remove the error, a method of compensating for the phase shift can be implemented by a processing circuit, such as processing circuit 168 of FIG. 1.

Figure 9:
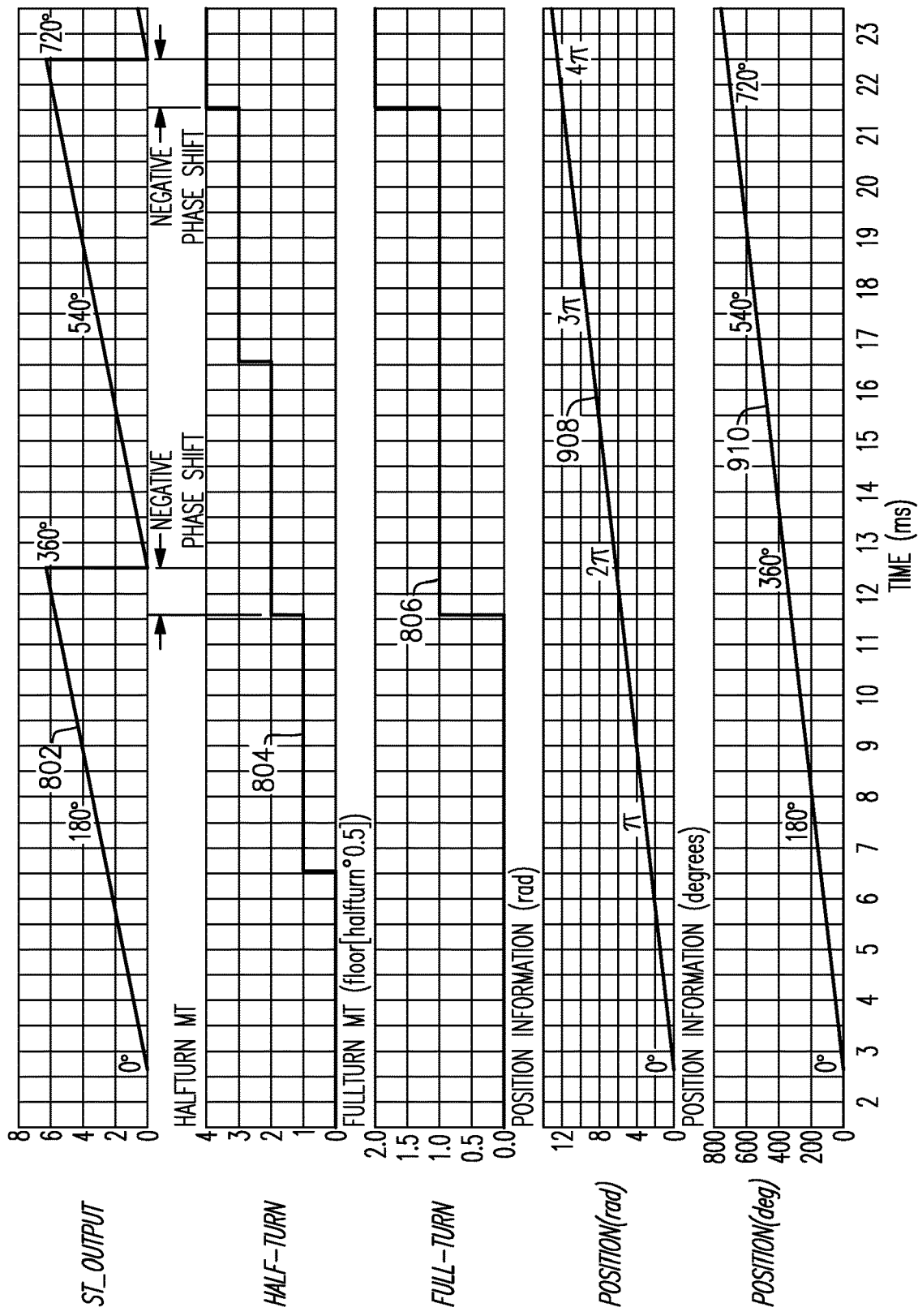
FIG. 9 shows simulated plots of angular position information with correction for negative phase shifting according to the embodiment.

FIG. 9 shows simulated plots 802, 804, 806, 908, and 910 of angular position information with correction for negative phase shifting according to an embodiment. A phase shift correction can be determined and applied by the processing circuit 168 to correct for the relative phase shift between the ST angle output data ST_Output and the half-turn count Half_turn. The phase shift correction can be subtracted from the sum of the ST angle output data ST_Output and the half-turn count Half_turn at certain times to calculate the angle position data Position in a manner that compensates for the relative phase shift between these signals. In FIG. 8, there is an error in angle position data Position when the multi-turn sensor output moves on to a value that corresponds to the second turn in the sequence (at 11.5 ms) as evident from the even value of the half-turn count while the ST sensor output is still in the first turn in the sequence. Therefore, a correction of decrementing one full-turn (subtracting 360 degrees) can be applied when the half-turn count Half_turn is even and the ST angle output data ST_Output is in the fourth quadrant (greater than 270 degrees) of the previous turn. By subtracting 360 degrees under these conditions, the processing circuit 168 can correct for the errors associated with the relatively phase shift between the ST angle output data ST_Output and the half-turn count Half_turn. This can yield continuous plots 908 and 910 of the overall rotation angle position data Position.

Figure 10:
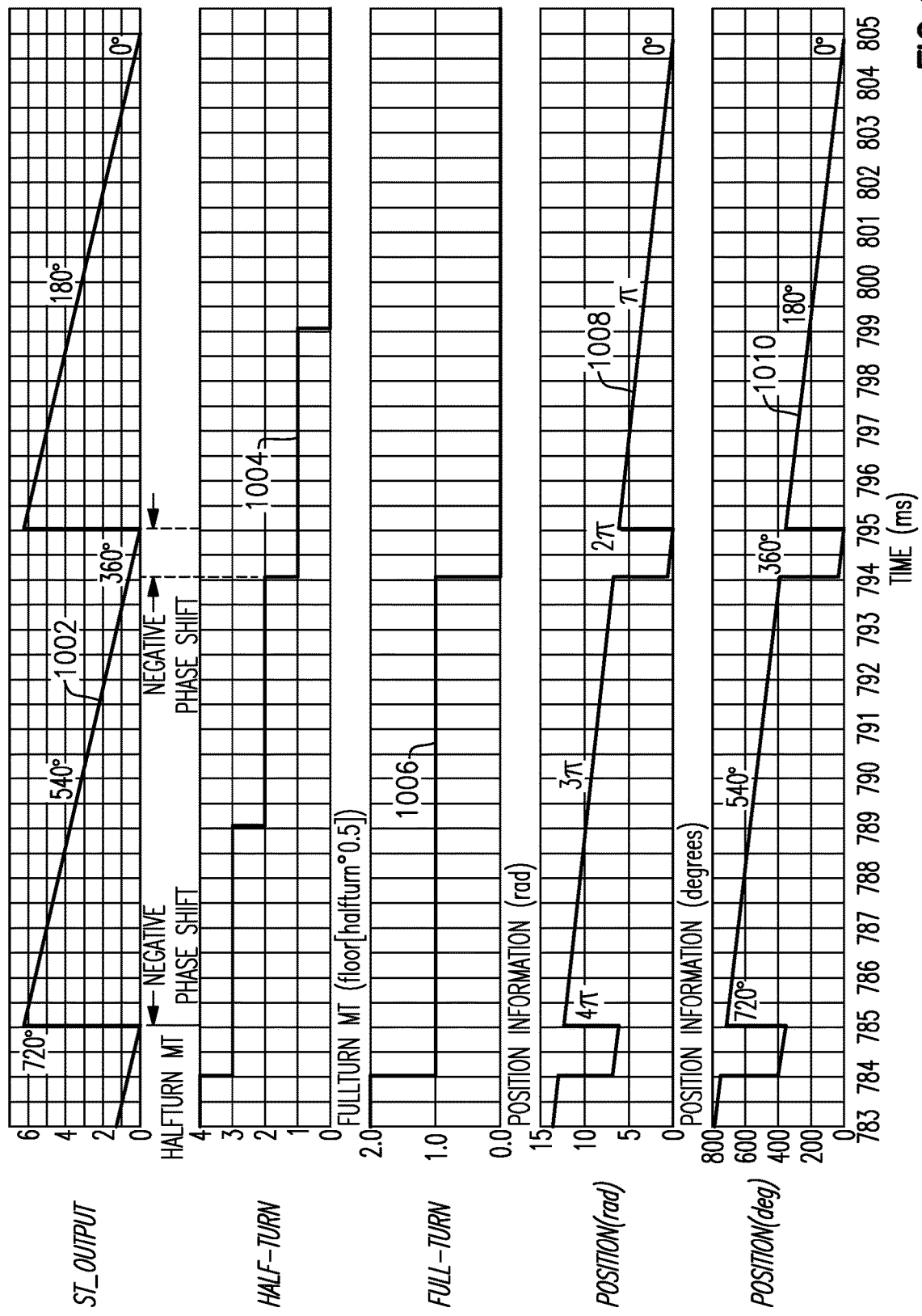
FIG. 10 shows simulated plots of angular position information with negative phase shifting in which angular position is changing in an opposite direction relative to the simulated plots of FIG. 8.

FIG. 10 shows simulated plots 1002, 1004, 1006, 1008, and 1010 of angular position information with negative phase shifting in which angular position is changing in an opposite direction relative to the simulated plots of FIG. 8. Plot 1002 shows the ST angle output data ST_Output when the magnetic field is rotating with an angle decreasing from 360 to 0 degrees. The plots of FIG. 10 are like the plots of FIG. 8, except the magnetic field is rotating in the opposite direction. Plot 1004 is the half-turn count Half-turn which is determined by the signals originating from an MT sensor. Plot 1006 is a plot of the full turn count Full-turn, for example, as determined by Equation 1. In FIG. 10, there is a time delay of approximately 1.0 ms between certain transitions in plot 1004 of the half-turn count Half-turn and corresponding transitions in the plot 1002 of the single turn angle output data ST_Output. The time delay corresponds to a phase shift, which can in turn introduce an error in the overall rotation angle position data Position. For instance, due to the negative phase shift, there are discontinuities in plots 1008 and 1010 of the overall rotation angle position data Position(rad) and Position(deg), respectively. The error is present when the multi-turn sensor output moves on to a value that corresponds to the last turn in the sequence (at 794 ms) as evident from the odd value of the halfturn count Half-Turn while the ST sensor output data ST_Output still corresponds to the second to last turn in the sequence.

The errors in the overall rotation angle position data Position and are shown to occur in the plots 1008 and 1010 at times of approximately 784 ms to 785 ms and 794 ms to 795 ms. To remove the errors, a method of compensating for the relative phase shift can be implemented by a processing circuit, such as processing circuit 168 of FIG. 1.

Figure 11:
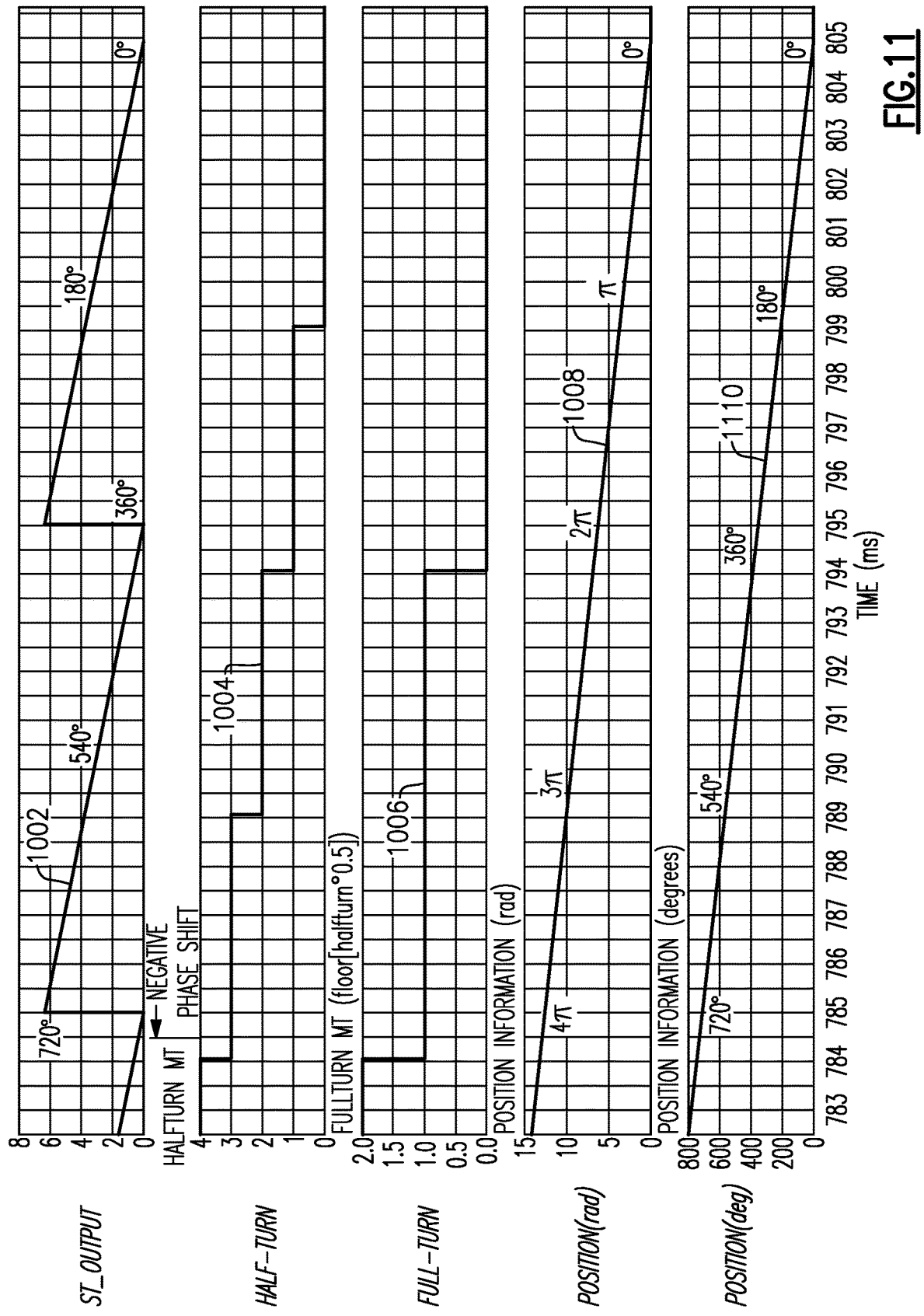
FIG. 11 shows simulated plots of angular position information with correction for negative phase shifting according to an embodiment.

FIG. 11 shows simulated plots 1002, 1004, 1006, 1108, and 1110 of angular position information with correction for negative phase shifting according to an embodiment. A phase shift correction can be determined and applied by the processing circuit 168 to correct for the relative phase shift between the ST angle output data ST_Output and the half-turn count Half_turn. The phase shift correction can be added to the ST angle output data ST_Output and the half-turn count Half_turn at certain times to calculate the angle position data Position in a manner that compensates for the relative phase shift between these signals. In FIG. 10, there is an error in angle position data Position when the multi-turn sensor output moves on to a value that corresponds to the last turn in the sequence (at 794 ms) as evident from the odd value of the half-turn count while the ST sensor output data ST_Output still corresponds to the second to last turn in the sequence. Therefore, a correction of one full-turn by adding 360 degrees can be applied when the half-turn count Half_turn is odd and the ST angle output data ST_output is in the first quadrant (less than 90 degrees) of the previous turn in the sequence. By adding 360 degrees under these circumstances, the processing circuit 168 can correct for the relative phase shift between the ST angle output data ST_Output and the half-turn count Half_turn. This can result in continuous plots 1108 and 1110 for the overall rotation angle position data Position.

The correction method as described in the discussion of FIGS. 3 through 11 can be summarized as shown in Table 1. Any suitable electronic circuitry can determine a phase shift correction based on the principles and advantages of Table 1. Such electronic circuitry can include a processing circuit, an ASIC, a microcontroller, a microprocessor, etc. Referring to Table 1, the first column shows the half-turn count Half_turn type, which is either even or odd parity. The half turn count Half_turn begins with odd parity (first row) in Table 1. The second column shows the ST angle output data ST_Output in degrees. The third column shows the ST angle output data ST_Output in radians. The fourth and fifth columns represent the correction to be applied based on the half-turn count and the ST angle in degrees and radians, respectively. The fourth column shows the correction term to be applied (e.g., added or subtracted) to the overall angle position data Position in degrees. The fifth column shows the correction term to be applied to the overall angle position data Position in radians.

TABLE 1

| HT Count | ST Angle Degree | ST Angle Rad | Correction Degree | Correction Rad |
|---|---|---|---|---|
| Odd | <90° | <π/2 | Add 360° | Add 2π |
| Odd | >90° | >π/2 | None | None |
| Even | >270° | >3π/2 | Subtract 360° | Subtract 2π |
| Even | <270° | <3π/2 | None | None |

Table 1 corresponds to a particular arrangement of a multi-turn sensor arranged relative to an angle sensor. Each of the phase shift correction values in Table 1 can be adjusted to account for an additional phase shift resulting from a different placement (e.g., a different angle) of the multi-turn sensor relative to an angle sensor. The additional adjustment can be an adjustment by a predetermined or fixed amount. Table 2 below summarizes an example of phase shift correction that includes the phase shift correction of Table 1 and an adjustment by a predetermined amount. Any suitable electronic circuitry can determine a phase shift correction based on the principles and advantages associated with Table 2. Such electronic circuitry can include a processing circuit, an ASIC, a microcontroller, a microprocessor, etc. As shown in Table 2, an additional adjustment of X° relative to the adjustments in Table 1 can be applied to compensate for the phase shift resulting from the different placement of the multi-turn sensor relative to an angle sensor. X can be any suitable positive or negative value for such compensation. X can be a predetermined value that is based on the arrangement of a multi-turn sensor relative to an angle sensor. Table 2 indicates that non-zero phase shift correction can be applied for each combination of half-turn count from the multi-turn sensor and angle from the angle sensor. While Table 2 includes angle and correction values in degrees, radian values can alternatively or additionally be used.

TABLE 2

| HT Count | ST Angle | Correction |
|---|---|---|
| Odd | <90° | +360° + X° |
| Odd | >90° | +X° |

TABLE 2-continued

| HT Count | ST Angle | Correction |
|---|---|---|
| Even | >270° | −360° + X° |
| Even | <270° | +X° |

Table 1 corresponds to X being equal to zero in Table 2. Tables 1 and 2 show that the phase shift correction discussed herein can correspond to adding a full turn for an odd half turn count when an angle is less than 90° relative to when the angle is greater than 90°. Tables 1 and 2 also show that the phase shift correction discussed herein can correspond to subrating a full turn for an even half turn count when an angle is greater than 270° relative to when the angle is less than 270°.

Although Tables 1 and 2 correspond to arrangements where the half-turn count Half_turn type begins with odd parity, other configurations and/or arrangements are possible. For instance, the half-turn count type can begin with even parity as shown in Table 3. Table 3 corresponds to when an initial half turn count begins with even parity. This can be due to a variety of circumstances. For instance, for functional safety reasons, the half turn count can start with an odd parity in some applications. Table 3 below summarizes an example similar to that of Table 2 except with opposite parity (even swapped with odd) in the first column. The case where X equals zero in Table 3 corresponds to swapping parity values in Table 1.

TABLE 3

| HT Count | ST Angle | Correction |
|---|---|---|
| Even | <90° | +360° + X° |
| Even | >90° | +X° |
| Odd | >270° | −360° + X° |
| Odd | <270° | +X° |

Tables 1 to 3 illustrate that the phase shift correction can be determined based on the half turn count having a particular parity value and the single turn angle being within a particular range. Tables 1 to 3 illustrate that the phase shift correction can correspond to adding 360° when the half-turn count is a particular parity (i.e., odd in Table 1 and 2 or even in Table 3) and the output of angle sensor corresponds to an angle of less than 90°. In these tables, a phase shift of either 360° or 360°+X° is added for the half-turn count of the particular parity and the angle of less than 90°. Such a phase shift adjustment is 360° more than for a half-turn count of the particular parity and an angle of greater than 90°. Tables 1 to 3 also illustrate that the phase shift correction can correspond to subtracting 360° when the half-turn count is the opposite of the particular parity (i.e., even in Table 1 and 2 or odd in Table 3) and the output of angle sensor corresponds to an angle of greater than 270°. In these tables, a phase shift of either −360° or −360°+X° is added for the half-turn count of the opposite particular parity and the angle of great than 270°. Such a phase shift adjustment is 360° less than for a half-turn count of the opposite of the particular parity and an angle of less than 270°.

A multi-turn sensor can provide various outputs that can be decoded into a half-turn count. For instance, a multi-turn sensor, such as the multi-turn sensor 100 of FIG. 1 and/or the multi-turn sensor 100 of FIG. 2A, can provide various half-bridge outputs. To determine a half-turn count, the half-bridge outputs can be measured and populated into memory. The half-bridge outputs can be voltages. The half-bridge outputs can be captured out of order of a magnetic count sequence to reduce and/or minimize power dissipation. The output values stored in the memory can then be re-arranged into a magnetic count sequence. The half-turn count can then be determined from the values stored in memory. Example methods of determining a half-turn count will now be discussed with reference to plots and flow diagrams. A half-turn decoder, such as the half-turn decoder 169 of FIG. 1, can decode the multi-turn sensor output.

Figure 12A:
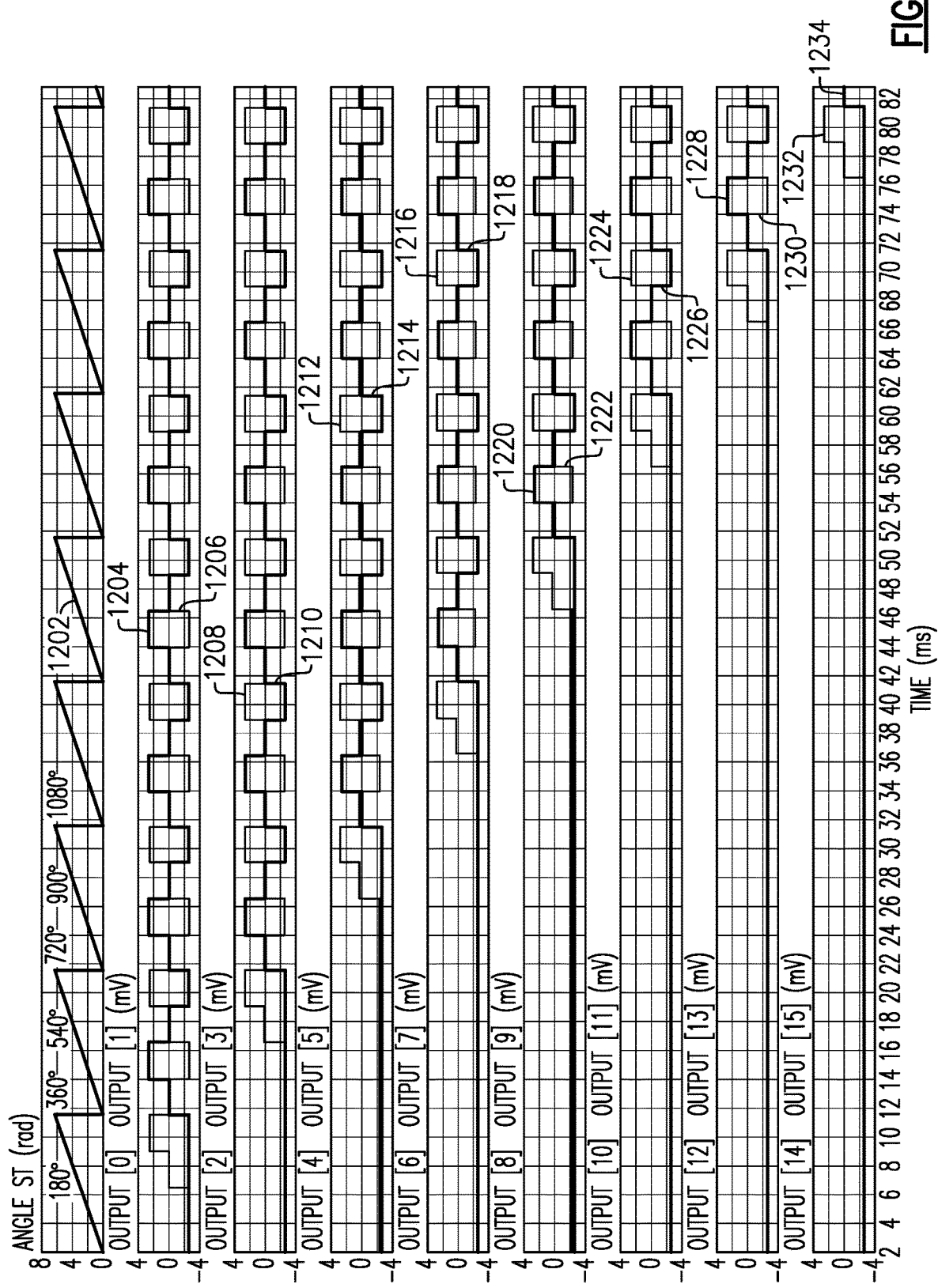
FIG. 12A shows simulated sensor output plots associated with a half-turn decoder.

FIG. 12A shows simulated sensor outputs plots 1202, 1204, 1206, 1208, 1210, 1212, 1214, 1216, 1218, 1220, 1222, 1224, 1226, 1228, 1230, 1232, and 1234 associated with a half-turn decoder. The sensor outputs all have a low value (e.g., around −2 millivolts) for a half-turns count of zero. In FIG. 12A, the sensor outputs are all initialized low. Plot 1202 is a plot of the ST angle output data ST_Output 1202 indicating angle versus time (ms). Plots 1204, 1206, 1208, 1210, 1212, 1214, 1216, 1218, 1220, 1222, 1224, 1226, 1228, 1230, 1232, and 1234 are a zeroth, first, second, third, fourth, fifth, sixth, seventh, eighth, ninth, tenth, eleventh, twelfth, thirteenth, fourteenth, and fifteenth output signal, respectively, each provided by the multi-turn sensor. Each can also be a voltage of a Wheatstone bridge circuit associated with the MT sensor 100. In some instances, the MT sensor 100 can have a total of 80 half-bridge voltages from which can be measured and populated into an array. With 80 half-bridges, the MT sensor 100 can count 40 turns. In general, certain MT sensors can count half as many turns as half-bridges. The array elements can be re-arranged into the magnetic sequence and decoded using a half-turn decoding process, for example, as described with reference to FIG. 12B.

Figure 12B:
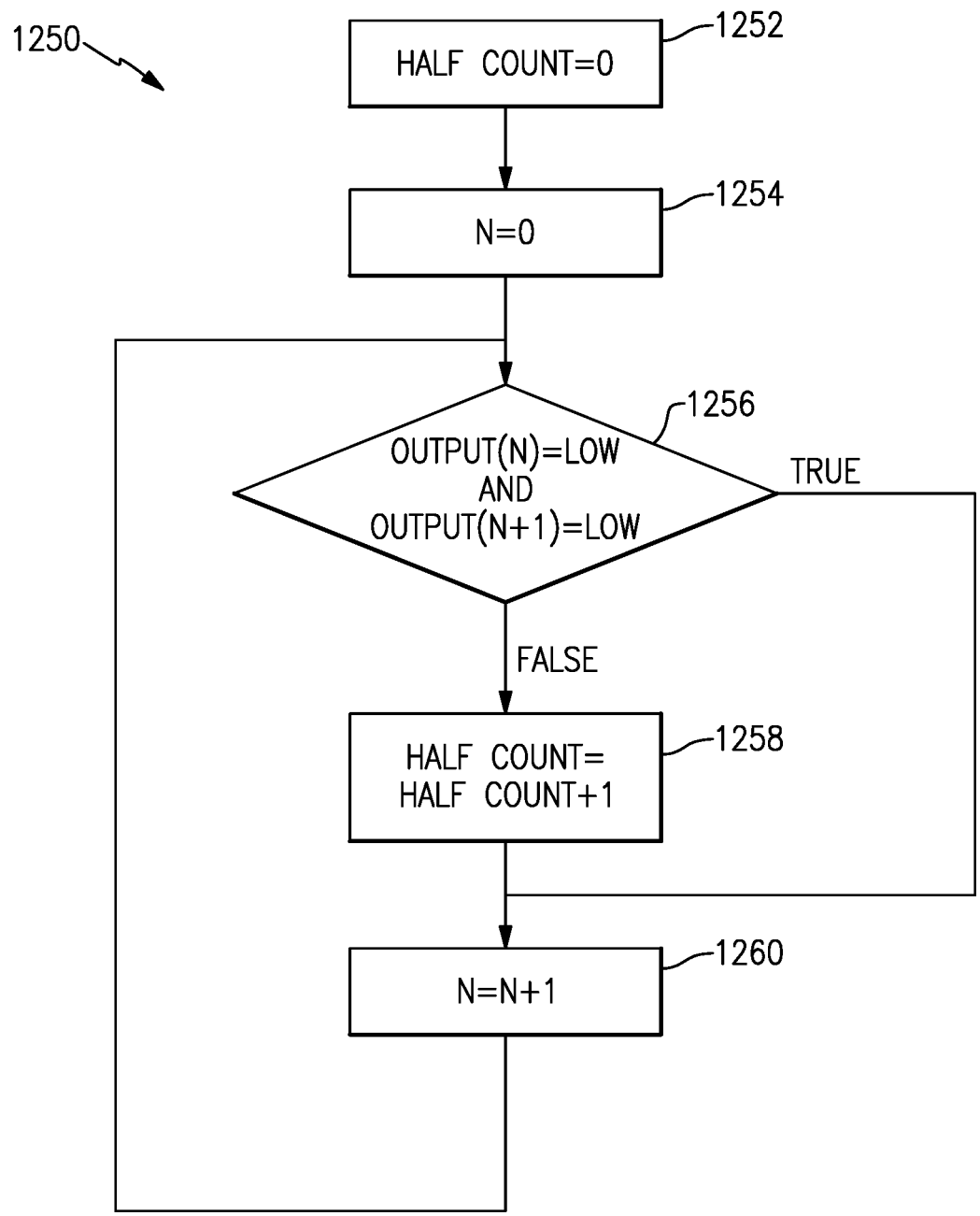
FIG. 12B is a flow diagram of process of decoding half-turns from an output of a multi-turn sensor according to an embodiment.

FIG. 12B is a flow diagram of a process 1250 of decoding half-turns from an output of a multi-turn sensor according to an embodiment. The process 1250 can be implemented by any suitable electronic circuitry configured to determine a half-turn count from a multi-turn sensor output. For instance, the processing circuit 168 of FIG. 1 can include a half-turn decoder 169 arranged to implement the process 1250. As another example, a half-turn decoder can be integrated with the multi-turn sensor and provide a half-turn count to a processing circuit. The process 1250 initializes the half-turn count Half-turn at block 1252 by setting Half-turn to 0. As described with respect to FIG. 12A, the sensor can be initialized such that all sensor outputs have a low value. When all sensor outputs are low, the half-turn count can equal zero. At block 1254, an integer index N is set to 0. The process 1250 uses the integer index N as a pointer or index of an output vector Output(N), where each value of the output vector Output(N) corresponds to one of the half-bridge output voltages of FIG. 12A. At block 1256, the process 1250 determines if the half-bridge output voltages Output(N) and Output(N+1) are asserted or not. If at least one of Output(N) and Output(N+1) is asserted (e.g., does not have a low value such as around −2 millivolts), then the half-turn count Half-turn is incremented by one at block 1258. Alternatively, if both of Output(N) and Output(N+1) are not asserted (e.g., have low values), then the half-turn count Half-turn is not incremented. At block 1260, the integer index N is incremented. Following block 1260, the process 1250 can loop back to decision block 1256. The process 1250 can proceed until each of the outputs of the multi-turn sensor has been processed.

Figure 13A:
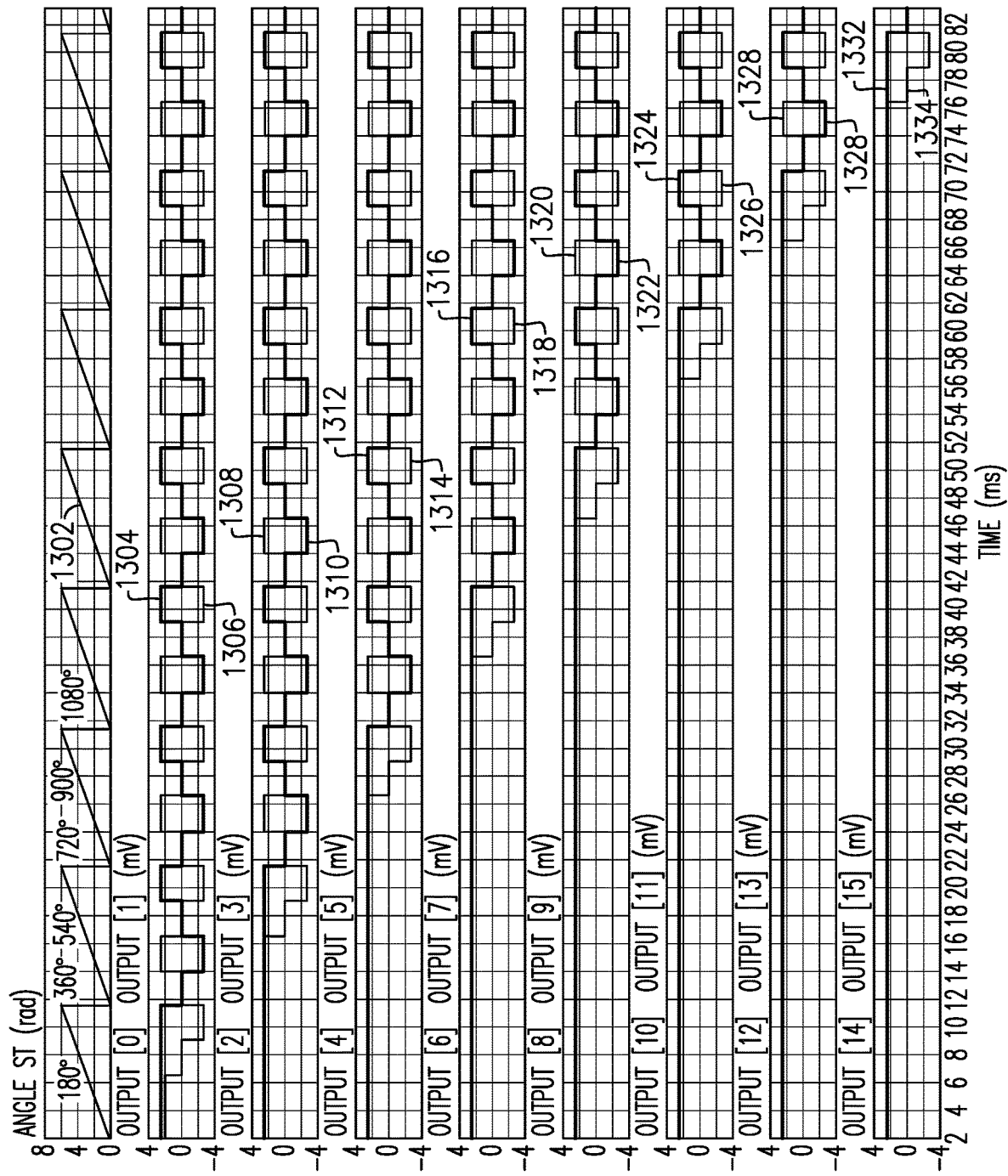
FIG. 13A shows simulated sensor output plots associated with a half-turn decoder.
Figure 13B:
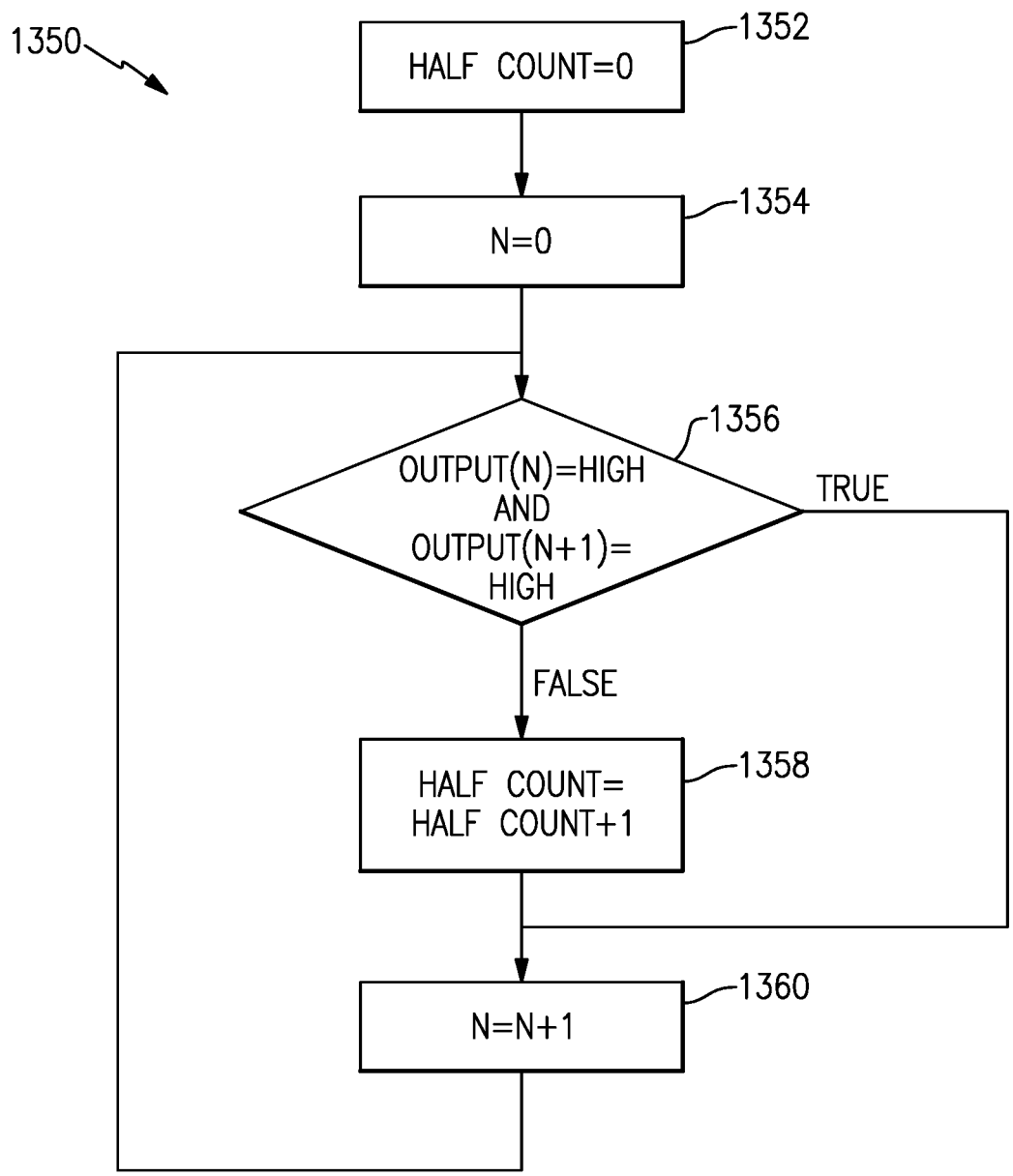
FIG. 13B is a flow diagram of a process of decoding half-turns from an output of a multi-turn sensor according to an embodiment.

FIG. 13A shows sensor outputs plots 1302, 1304, 1306, 1308, 1310, 1312, 1314, 1316, 1318, 1320, 1322, 1324, 1326, 1328, 1330, 1332, and 1334 associated with a half-turn decoder. The sensor outputs all have a high value (e.g., around 2 millivolts) for a half-turns count of zero. In FIG. 13A the sensor outputs are all initialized high. Plot 1302 is a plot of the ST angle output data ST_Output indicating angle versus time (ms). Plots 1304, 1306, 1308, 1310, 1312, 1314, 1316, 1318, 1320, 1322, 1324, 1326, 1328, 1330, 1332, and 1334 are a zeroth, first, second, third, fourth, fifth, sixth, seventh, eighth, ninth, tenth, eleventh, twelfth, thirteenth, fourteenth, and fifteenth output signal, respectively, each provided by the multi-turn sensor. Each can also be a voltage of a Wheatstone bridge circuit associated with the MT sensor 100. In some instances, the MT sensor 100 can have a total of 80 half-bridge voltages from which can be measured and populated into an array. The array elements can be re-arranged into the magnetic sequence and decoded using a half-turn decoding process, for example, as described with reference to FIG. 13B FIG. 13B shows a flow diagram of a process 1350 of decoding half-turns according to an embodiment. The process 1350 can be implemented by any suitable electronic circuitry configured to determine a half-turn count from a multi-turn sensor output. For instance, the processing circuit 168 of FIG. 1 can include a half-turn decoder 169 arranged to implement the process 1350. As another example, a half-turn decoder can be integrated with the multi-turn sensor and provide a half-turn count to a processing circuit. The process 1350 is like the process of FIG. 12B except the sensor states are inactive high if two consecutive outputs are high instead of inactive low if two consecutive outputs are low and the sensor is initialized differently in the process 1350. The sensor can be initialized such that all sensors outputs have a high value. When all sensor outputs are high, the half-turns count can equal zero.

The process 1350 initializes the half-turn count Half-turn at block 1352 by setting Half-turn to 0. At block 1354, an integer index N is set to 0. The process 1350 uses the integer index N as a pointer or index of an output vector Output(N), where each value of the output vector Output(N) corresponds to one of the half-bridge voltages of FIG. 13A. At block 1356, the process 1350 determines if the half-bridge output voltages Output(N) and Output(N+1) are both high. If at least one of output voltages Output(N) and Output(N+1) does not have a high value, then the half-turn count Half-turn is incremented by one at block 1358. Alternatively, if both output voltages Output(N) and Output(N+1) have a high value, then the half-turn count Half-turn is not incremented. At block 1360, the integer index N is incremented. Following block 1360, the process 1350 can loop back to decision block 1356. The process 1350 can proceed until each of the outputs of the multi-turn sensor has been processed.

Figure 14:
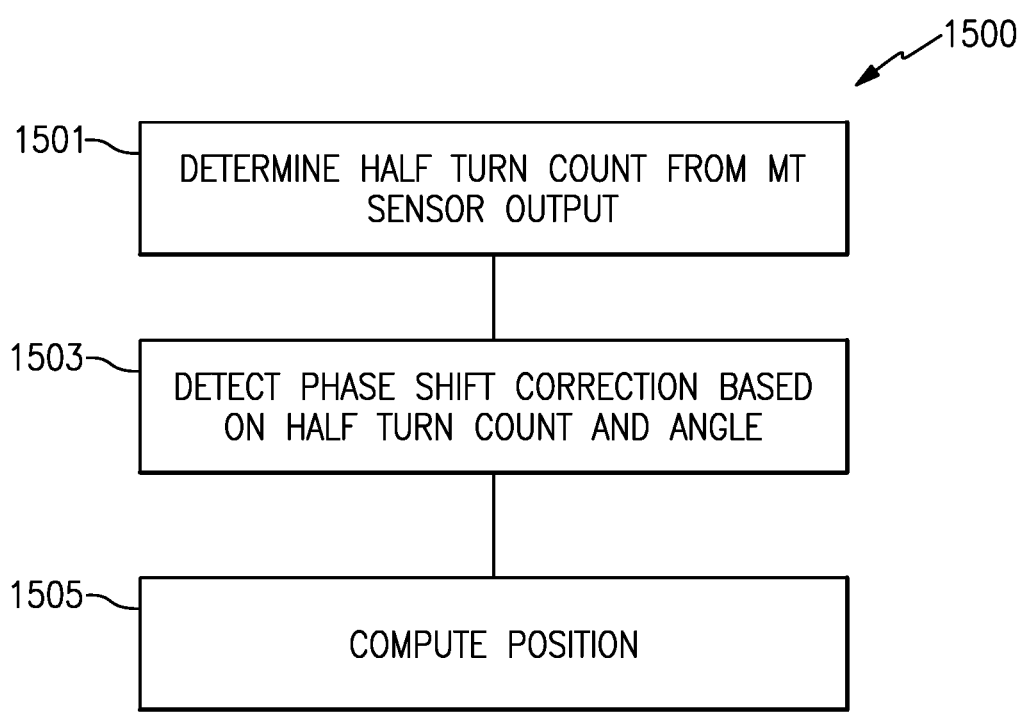
FIG. 14 is a flow diagram of a process for computing position with phase shift compensation according to an embodiment.

FIG. 14 is a flow diagram of a process 1500 of for computing position with phase shift compensation according to an embodiment. The process 1500 can be performed using any suitable circuitry, such as the processing circuit 168 of FIG. 1. At block 1501, the half-turn count Half-turn can be decoded from the output of the MT sensor. This can be involve, for instance, using any suitable principles or advantages of the half-turn decoder processes of FIG. 12B and/or FIG. 13B.

At block 1503, a phase shift correction can be determined based on the half-turn count Half-turn and the ST angle output data ST_Output from the angle sensor. Determining the phase shift correction can involve determining whether the half-turn count Half-turn and the ST angle output data ST_Output have that values that indicate a phase shift correction in Table 1 and/or Table 2 and/or Table 3 above. For instance, when the half-turn count Half-turn is Odd and the ST angle output data ST_Output corresponds to less than 90° (or 7c/2 radians), the phase shift correction can be adding 360° (or 2π radians). As another example, when the half-turn count Half-turn is Even and the ST angle output data ST_Output corresponds to more than 270° (or 3π/2 radians), the phase shift correction can be subtracting 360° (or 2π radians). No phase shift correction may be determined if the half-turn count Half-turn and the ST_angle output data ST_Output have other combinations of values as indicated in Table 1 and/or Table 2 and/or Table 3 above. This can indicate that the outputs of the multi-turn sensor and the angle sensor are sufficiently aligned such that no phase shift correction is needed.

At block 1505, the overall rotation angle position data Position is computed in either units of radians or degrees or both. The angle position data Position can be computed using the half-turn count Half-Turn, the ST angle output data ST_Output, and the phase shift correction such that the angle position data Position is free from error associated with a phase shift between outputs of an MT sensor and an angle sensor.

Figure 15A:
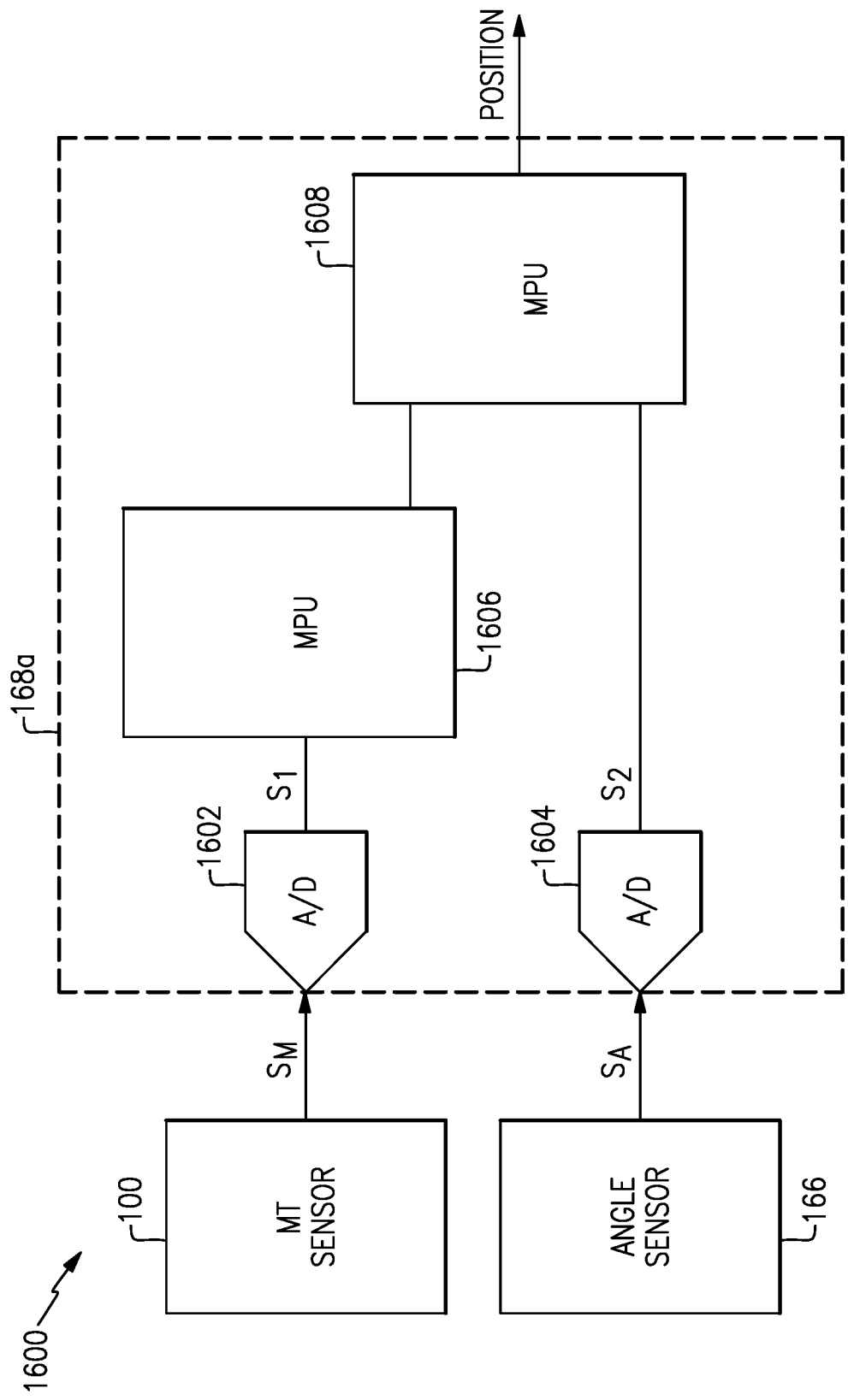
FIG. 15A is a schematic block diagram of a magnetic angle sensor system that includes a multi-turn sensor, angle sensor, and a processor according to an embodiment.

FIG. 15A is a schematic block diagram of a magnetic angle sensor system 1600 that includes a multi-turn sensor 100, an angle sensor 166, and a processor 168a according to an embodiment. As illustrated, the processor 168a includes an analog-to-digital converter (ADC) 1602, an ADC 1604, a microcontroller 1606, and a microprocessor 1608. In the embodiment of FIG. 15A, the processor 168a receives signals $S_M$ from the MT sensor 100 and signals $S_A$ the angle sensor 166. The signals $S_M$ and $S_A$ can be analog signals such as voltage signals from Wheatstone bridges. The signals $S_M$ from the MT sensor 100 can be converted to digital signals $S_1$ by the ADC 1602, and the signals $S_A$ from the angle sensor 166 can be converted to digital signals $S_2$ by the ADC 1604. The ADC 1604 provides the digital signals $S_2$ to the microcontroller 1606, which in turn can convert and process this information into the ST angle output data ST_output. The MPU 1608 can combine both the ST angle output data ST_output and the digital signals $S_1$ from the ADC 1602 to calculate the overall rotation angle position data Position. The microcontroller 1606 can decode the output of the MT sensor 100 to determine a half-turns count. Accordingly, the microcontroller 1606 can include a half-turn decoder. The microcontroller 1608 can be programmed to implement phase shift correction in accordance with Table 1 and/or Table 2 and/or Table 3 to remove discontinuities due to phase offset between signals associated with the angle sensor 166 and the MT sensor 100.

Figure 15B:
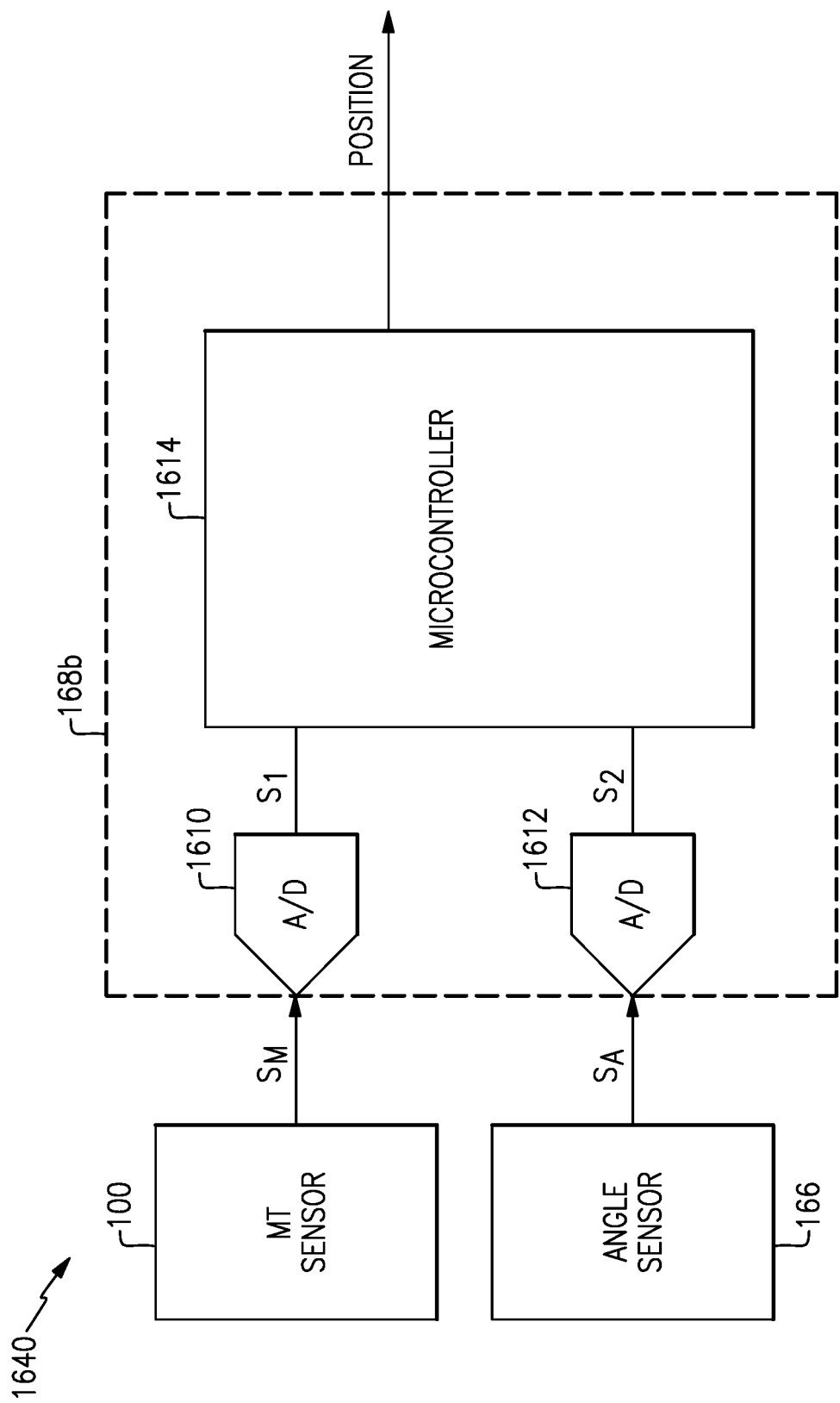
FIG. 15B is a schematic block diagram of a magnetic angle sensor system that includes a multi-turn sensor, angle sensor, and a processor according to another embodiment.

FIG. 15B is a schematic block diagram of a magnetic angle sensor system 1640 including the multi-turn sensor 100, the angle sensor 166, and a processor 168b according to another embodiment. The processor 168b is similar to the processor 168a of FIG. 15A except it includes an application specific integrated circuit (ASIC) 1610, a microcontroller 1614, and the ADC 1604. Like in the processor 168a of FIG. 15A, the ADC 1604 converts signals $S_A$ from the angle sensor 166 into digital signals $S_2$. The signals $S_M$ from the MT sensor 100 are provided to the ASIC 1610, which provides a digital signal $S_3$ to the microcontroller 1614. The ASIC 1610 can decode the output of the MT sensor 100 to determine a half-turns count. Accordingly, the ASIC 1610 can include a half-turn decoder. The half-turns count can be provided as a digital output of the ASIC 1610. The ASIC 1610 can be integrated with the MT sensor 100 in certain applications. The microcontroller 1614 can process the digital signals $S_2$ and $S_3$ to determine the overall rotation angle position data Position. In the embodiment of FIG. 15B, phase shift correction on accordance with Table 1 and/or Table 2 and/or Table 3 above can be implemented within the microcontroller 1614 to remove discontinuities due to phase offset errors between signals associated with the angle sensor 166 and the MT sensor 100.

Figure 15C:
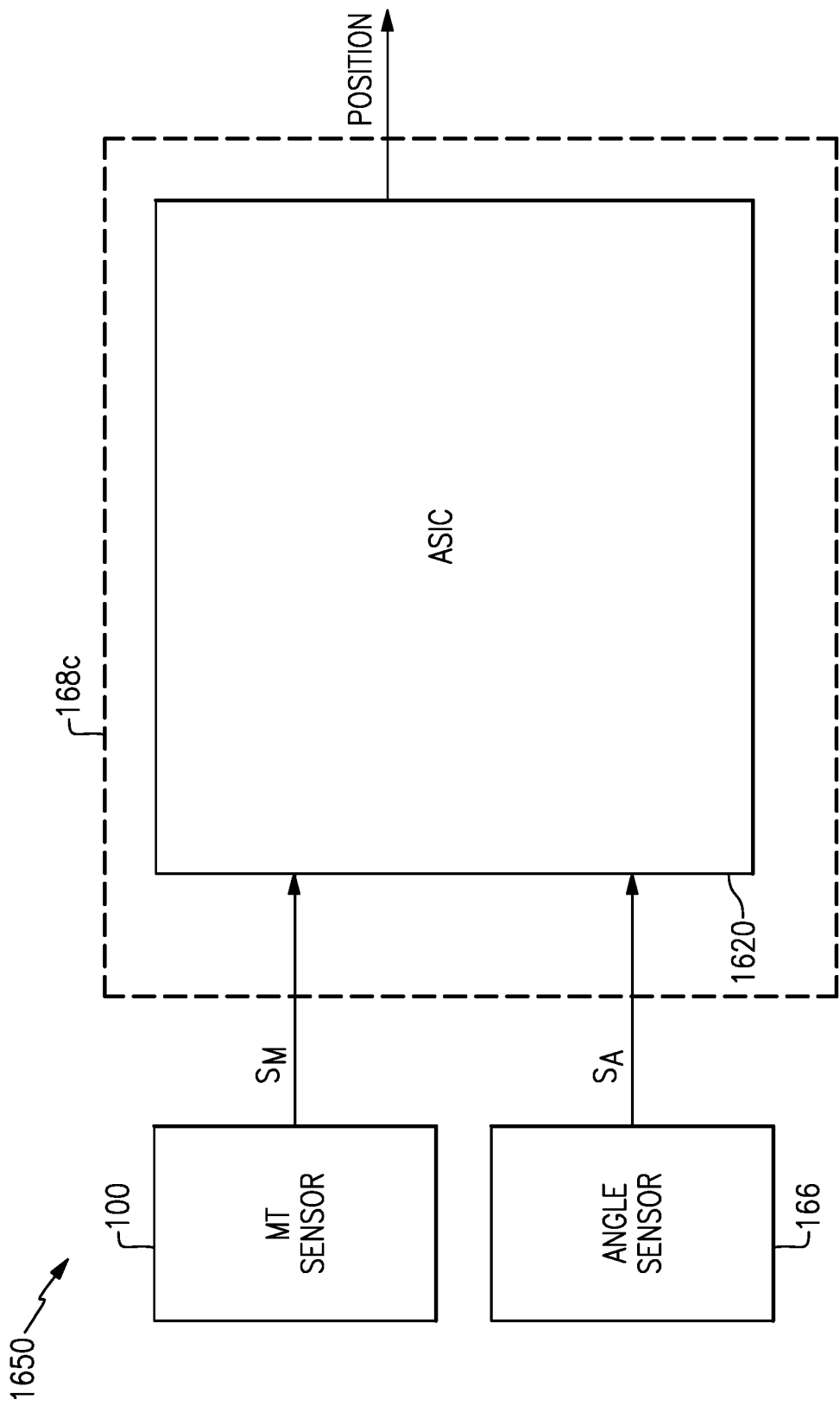
FIG. 15C is a schematic block diagram of a magnetic angle sensor system that includes a multi-turn sensor, angle sensor, and a processor according to another embodiment.

FIG. 15C is a schematic block diagram of a magnetic angle sensor system 1650 including the multi-turn sensor 100, the angle sensor 166, and a processor 168c according to an embodiment. The processor 168c is similar to the processors 168a and 168b except that the process 168c includes an ASIC 1620 to processes outputs of the MT sensor 100 and the angle sensor 166. The ASIC 1620 can compute the overall rotation angle position data Position. In the embodiment of FIG. 15C, the phase shift correction in accordance with Table 1 and/or Table 2 and/or Table 3 above can be implemented within the ASIC 1620 to remove discontinuities due to phase offset between signals associated with the angle sensor 166 and the MT sensor 100.

Any of the principles and advantages discussed herein can be applied to other systems, not just to the systems described above. Some embodiments can include a subset of features and/or advantages set forth herein. The elements and operations of the various embodiments described above can be combined to provide further embodiments. The acts of the methods discussed herein can be performed in any order as appropriate. Moreover, the acts of the methods discussed herein can be performed serially or in parallel, as appropriate. While circuits are illustrated in particular arrangements, other equivalent arrangements are possible.

Any of the principles and advantages discussed herein can be implemented in connection with any other systems, apparatus, or methods that benefit could from any of the teachings herein. For instance, any of the principles and advantages discussed herein can be implemented in connection with any devices with a need for correcting rotational angle position data derived from rotating magnetic fields. Additionally, the devices can include any magnetoresistance or Hall effect devices capable of sensing magnetic fields.

Aspects of this disclosure can be implemented in various electronic devices or systems. For instance, phase correction methods and sensors implemented in accordance with any of the principles and advantages discussed herein can be included in various electronic devices and/or in various applications. Examples of the electronic devices and applications can include, but are not limited to, servos, robotics, aircraft, submarines, toothbrushes, biomedical sensing devices, and parts of the consumer electronic products such as semiconductor die and/or packaged modules, electronic test equipment, etc. The consumer electronic products can include, but are not limited to, a phone such as a smart phone, a laptop computer, a tablet computer, a wearable computing device such as a smart watch or an ear piece, an automobile, a camcorder, a camera, a digital camera, a portable memory chip, a washer, a dryer, a washer/dryer, a copier, a facsimile machine, a scanner, a multifunctional peripheral device, etc. Further, the electronic devices can include unfinished products, including those for industrial, automotive, and/or medical applications.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or "connected", as generally used herein, refer to two or more elements that may be either directly connected, or connected by way of one or more intermediate elements. Thus, although the various schematics shown in the figures depict example arrangements of elements and components, additional intervening elements, devices, features, or components may be present in an actual embodiment (assuming that the functionality of the depicted circuits is not adversely affected). The words "based on" as used herein are generally intended to encompass being "based solely on" and being "based at least partly on." Additionally, the words "herein," "above," "below," and words of similar import, when used in this application, shall refer to this application as a whole and not to any particular portions of this application. Where the context permits, words in the Detailed Description of Certain Embodiments using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values or distances provided herein are intended to include similar values within a measurement error.

While certain embodiments have been described, these embodiments have been presented by way of example only, and are not intended to limit the scope of the disclosure. Indeed, the novel apparatus, systems, and methods described herein may be embodied in a variety of other forms. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure."

What is claimed is:

1. A magnetic sensor system with phase shift compensation, the magnetic sensor system comprising:
    a multi-turn sensor comprising magnetoresistive sensing elements configured to change state in response to rotations of a magnetic field such that the magnetoresistive sensing elements have a different state in response to the magnetic field rotating one full turn, the multi-turn sensor configured to generate an output;
    an angle sensor configured to generate an output based on an angle of the magnetic field relative to the angle sensor; and
    a processing circuit in communication with the multi-turn sensor and the angle sensor, the processing circuit configured to:
        determine a phase shift correction based on a relative phase difference between the output of the multi-turn sensor having a first value and the output of the angle sensor having a value,
            wherein the output of the multi-turn sensor having the first value indicates that a rotation of the rotations of the magnetic field completes, and
            wherein the phase shift correction corrects for the relative difference over a portion of the rotation of the magnetic field; and
        generate position information based on a combination of the phase shift correction, the output of the angle sensor, and the output of the multi-turn sensor.

2. The magnetic sensor system of claim 1, further comprising a half-turn decoder configured to output a count of half-turns based on the output of the multi-turn sensor, and wherein the processing circuit is configured to determine the phase shift correction based on the count of half-turns and the output of the angle sensor.

3. The magnetic sensor system of claim 2, wherein phase shift correction corresponds to adding 360° when the count of half-turns is a particular parity and the output of angle sensor corresponds to the angle of the magnetic field relative to the angle sensor being less than 90°, wherein the particular parity is either even or odd.

4. The magnetic sensor system of claim 3, wherein the phase shift correction corresponds to subtracting 360° when the count of half-turns is an opposite parity as the particular parity and the output of angle sensor corresponds to the angle of the magnetic field relative to the angle sensor being greater than 270°.

5. The magnetic sensor system of claim 2, wherein the phase shift correction corresponds to adding 360° when the count of half-turns is odd and the output of angle sensor corresponds to the angle of the magnetic field relative to the angle sensor being less than 90°.

6. The magnetic sensor system of claim 1, wherein the multi-turn sensor is a giant magnetoresistance sensor.

7. The magnetic sensor system of claim 1, wherein the angle sensor comprises an anisotropic magnetoresistive sensor.

8. The magnetic sensor system of claim 1, wherein the processing circuit is configured to compute the position information without the phase shift correction in response to determining that the output of the multi-turn sensor changes within a threshold phase of the output of the angle sensor.

9. The magnetic sensor system of claim 1, wherein the phase shift correction corresponds to an adjustment of 360° in the position information.

10. The magnetic sensor system of claim 1, wherein the position information is a cumulative rotation angle associated with the magnetic field over a range exceeding 360 degrees.

11. The magnetic sensor system of claim 10, wherein the processing circuit is configured to continuously output the position information.

12. A method of determining position information associated with a magnetic field, the method comprising:
    recording, with a multi-turn sensor comprising magnetoresistive sensing elements, a number of turns of the magnetic field as the magnetic field rotates for the number of turns, wherein the number of turns is greater than one;
    detecting, with an angle sensor, an angle of the magnetic field relative to the angle sensor as the magnetic field rotates;
    receiving a first signal associated with the multi-turn sensor;
    receiving a second signal associated with the angle sensor;
    generating a phase shift correction signal as the magnetic field rotates for the number of turns based on a relative phase difference between (i) the first signal associated with the multi-turn sensor indicating one full turn of the number of turns of the magnetic field completes and (ii) the second signal associated with the angle sensor, the phase shift correction correcting for the relative difference over a portion of the turn of the magnetic field; and
    using the phase shift correction signal in combination with the first signal and the second signal to generate an indicator of a position of the magnetic field.

13. The method of claim 12, further comprising decoding a count of half-turns from the first signal, wherein the generating is based on the count of half-turns.

14. The method of claim 12, wherein the first signal represents a count of half-turns.

15. The method of claim 14, wherein using the phase shift correction signal causes one full turn to be added when the count of half-turns is a particular parity and the second signal corresponds to the angle of the magnetic field relative to the angle sensor being less than one quarter turn, wherein the particular parity is either even or odd, and wherein using the phase shift correction signal causes one full turn to be subtracted when the count of half-turns is an opposite of the particular parity and the second signal corresponds to the angle of the magnetic field relative to the angle sensor being more than three quarters of a turn.

16. The method of claim 12, wherein the multi-turn sensor comprises a giant magnetoresistive sensor.

17. A processing circuit for determining a position associated with a magnetic field, the processing circuit comprising:
a first input configured to receive a first signal from a multi-turn sensor, the first signal indicating at least a number of turns of the magnetic field;
a second input configured to receive a second signal from an angle sensor that is separate from the multi-turn sensor, the second signal indicating a position of the magnetic field relative to the angle sensor; and
electronic circuitry configured to:
determine a phase shift correction signal based on a relative phase difference between (i) a step in value of the first signal from the multi-turn sensor caused by rotation of the magnetic field and (ii) a value of the second signal from the angle sensor;
combine the phase shift correction signal with the first signal and the second signal to generate position information associated with the magnetic field based on the phase shift correction and the first signal; and
output the position information.

18. The processing circuit of claim 17, wherein the electronic circuitry is configured to compute a count of half-turns based on the first signal and determine the phase shift correction based on the count of half-turns.

19. The processing circuit of claim 17, wherein the first signal represents a count of half-turns, and wherein the electronic circuitry is further configured to:
set the phase shift correction signal to add one full turn when the count of half-turns is a particular parity and the second signal corresponds to less than a quarter turn, the particular parity being either even or odd; and
set the phase shift correction signal to subtract one full turn when the count of half-turns is an opposite of the particular parity and the second signal corresponds more than a three quarter turn.

20. The processing circuit of claim 17, wherein the processing circuit is configured to continuously output the position information.

* * * * *